US012720987B2

(12) United States Patent
Jang et al.

(10) Patent No.: US 12,720,987 B2
(45) Date of Patent: Aug. 25, 2026

(54) DISPLAY APPARATUS

(71) Applicant: Samsung Display Co., Ltd., Yongin-si (KR)

(72) Inventors: Donghyeon Jang, Yongin-si (KR); Wonse Lee, Yongin-si (KR); Sungmin Son, Yongin-si (KR); Sujin Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 344 days.

(21) Appl. No.: 18/521,737

(22) Filed: Nov. 28, 2023

(65) Prior Publication Data

US 2024/0324375 A1 Sep. 26, 2024

(30) Foreign Application Priority Data

Mar. 24, 2023 (KR) ........................ 10-2023-0039179
Jul. 26, 2023 (KR) ........................ 10-2023-0097702

(51) Int. Cl.
*H10K 59/131* (2023.01)
*H10K 59/80* (2023.01)

(52) U.S. Cl.
CPC ....... *H10K 59/1315* (2023.02); *H10K 59/873* (2023.02)

(58) Field of Classification Search
CPC . H10K 59/1315; H10K 59/873; H10K 59/131
See application file for complete search history.

(56) References Cited

U.S. PATENT DOCUMENTS

| | | | | |
|---|---|---|---|---|
| 7,978,159 | B2 | 7/2011 | Kim et al. | |
| 10,955,948 | B2 | 3/2021 | Yao et al. | |
| 2021/0083033 | A1* | 3/2021 | Bang | H10K 59/131 |
| 2022/0336547 | A1* | 10/2022 | Zhou | H10K 59/88 |
| 2022/0376032 | A1* | 11/2022 | Okabe | H10K 59/124 |
| 2023/0115213 | A1 | 4/2023 | Na et al. | |
| 2024/0188353 | A1* | 6/2024 | Zhang | G09G 3/3208 |
| 2024/0206271 | A1* | 6/2024 | Zhang | G06F 3/041 |

FOREIGN PATENT DOCUMENTS

| | | | |
|---|---|---|---|
| CN | 108762571 | A | 11/2018 |
| KR | 10-0362275 | B1 | 11/2002 |
| KR | 10-1279117 | B1 | 6/2013 |
| KR | 10-2020-0133890 | A | 12/2020 |

* cited by examiner

*Primary Examiner* — Dao H Nguyen
(74) *Attorney, Agent, or Firm* — Womble Bond Dickinson (US) LLP

(57) ABSTRACT

A display apparatus including: a substrate; a plurality of data transfer lines in a peripheral area and adjacent to a second edge of the substrate and extending in a first direction; and first power connection lines in the peripheral area and adjacent to the second edge in a space between the first edge and the plurality of data transfer lines and extending in the first direction. A 1-1$^{th}$ power connection line that is nearest to the plurality of data transfer lines from among the first power connection lines includes a first conductive layer on a first insulating layer, and a 1-2$^{th}$ power connection line that is farthest away from the plurality of data transfer lines from among the first power connection lines includes a first conductive layer on the first insulating layer and a second conductive layer on a second insulating layer.

33 Claims, 12 Drawing Sheets

I
I'
II
II'
III
III'
410
411
413
415
310
311
313
315
150
140
131
122
121
110
100
210
211
213
215a
215b
PCL1
(PCL1-2)
PCL1-1, PCL1
PCL1'
DTL
PTW1
Z

DISPLAY APPARATUS

CROSS-REFERENCE TO RELATED APPLICATIONS

The present application claims priority to and the benefit of Korean Patent Application Nos. 10-2023-0039179, filed in the Korean Intellectual Property Office on Mar. 24, 2023, and 10-2023-0097702, filed in the Korean Intellectual Property Office on Jul. 26, 2023, the entire disclosures of both of which are incorporated herein by reference.

BACKGROUND

1. Field

Aspects of embodiments of the present disclosure relate to a display apparatus.

2. Description of the Related Art

A display apparatus has a display area, and pixels are arranged in the display area. Data lines are electrically connected to the pixels, and the pixels are configured to emit light having a brightness corresponding to electrical signals transferred from the data lines.

SUMMARY

However, in a related art display apparatus, the brightness of images displayed in a display area may be unexpectedly inconstant.

Embodiments of the present disclosure include a display apparatus capable of displaying high-quality images. However, this aspect and feature is an example, and the present disclosure is not limited thereto.

Additional aspects and features will be set forth, in part, in the description which follows and, in part, will be apparent from the description or may be learned by practice of the described embodiments of the present disclosure.

According to an embodiment of the present disclosure, a display apparatus includes: a substrate having a display area, a peripheral area outside the display area, a first edge extending in a first direction, and a second edge extending in a second direction crossing the first direction; a plurality of data transfer lines in the peripheral area, adjacent to the second edge, and extending in the first direction; first power connection lines in the peripheral area, adjacent to the second edge in a space between the first edge and the plurality of data transfer lines, and extending in the first direction. A 1-1$^{th}$ power connection line that is most adjacent to the plurality of data transfer lines from among the first power connection lines includes a first conductive layer on a first insulating layer, and a 1-2$^{th}$ power connection line that is farthest away from the plurality of data transfer lines from among the first power connection lines includes a first conductive layer on the first insulating layer and a second conductive layer on a second insulating layer.

The second insulating layer may be under the first insulating layer.

The first insulating layer may cover the second conductive layer in the 1-2$^{th}$ power connection line.

The first conductive layer and the second conductive layer in the 1-2$^{th}$ power connection line may overlap each other when viewed in a direction perpendicular to the substrate.

A length of the second conductive layer in the 1-2$^{th}$ power connection line in the first direction may be greater than a length of the first conductive layer in the 1-2$^{th}$ power connection line in the first direction.

The display apparatus may further include a first power input line on end portions of the first power connection lines in a direction away from the display area, electrically connected to the first conductive layer of the 1-1$^{th}$ power connection line, and electrically connected to each of the first conductive layer and the second conductive layer of the 1-2$^{th}$ power connection line.

The display apparatus may further include a first power transfer line on end portions of the first power connection lines in a direction toward the display area, electrically connected to the first conductive layer of the 1-1$^{th}$ power connection line, and electrically connected to each of the first conductive layer and the second conductive layer of the 1-2$^{th}$ power connection line.

The 1-2$^{th}$ power connection line may further include a third conductive layer on a third insulating layer.

The second insulating layer may be under the first insulating layer, and the third insulating layer may be under the second insulating layer.

The second insulating layer may cover the third conductive layer in the 1-2$^{th}$ power connection line, and the first insulating layer may cover the second conductive layer in the 1-2$^{th}$ power connection line.

The first conductive layer, the second conductive layer, and the third conductive layer included in the 1-2$^{th}$ power connection line may overlap one another when viewed in a direction perpendicular to the substrate.

A length of the second conductive layer in the 1-2$^{th}$ power connection line in the first direction may be greater than a length of the first conductive layer in the 1-2$^{th}$ power connection line in the first direction, and a length of the third conductive layer in the 1-2$^{th}$ power connection line in the first direction may be greater than the length of the second conductive layer in the 1-2$^{th}$ power connection line in the first direction.

The display apparatus may further include a first power input line on end portions of the first power connection lines in a direction away from the display area, electrically connected to the first conductive layer in the 1-1$^{th}$ power connection line, and electrically connected to each of the first conductive layer, the second conductive layer, and the third conductive layer in the 1-2$^{th}$ power connection line.

The display apparatus may further include a first power transfer line on end portions of the first power connection lines in a direction to the display area, electrically connected to the first conductive layer in the 1-1$^{th}$ power connection line, and electrically connected to each of the first conductive layer, the second conductive layer, and the third conductive layer in the 1-2$^{th}$ power connection line.

The display apparatus may further include a plurality of driving power lines extending in the first direction and extending into the display area. The first power transfer line may extend along the second edge and may be electrically connected to the plurality of driving power lines.

The display apparatus may further include second power connection lines in the peripheral area, adjacent to the second edge in a space between the first edge and the first power connection lines and extending in the first direction. Each of the second power connection lines may include a first conductive layer on the first insulating layer and a second conductive layer on the second insulating layer.

The second insulating layer may be under the first insulating layer.

The first insulating layer may cover the second conductive layer in the 1-2$^{th}$ power connection line and the second conductive layer in each of the second power connection lines.

The first conductive layer and the second conductive layer in the 1-2$^{th}$ power connection line may overlap each other when viewed in a direction perpendicular to the substrate, and the first conductive layer and the second conductive layer in each of the second power connection lines may overlap each other when viewed in the direction perpendicular to the substrate.

A length of the second conductive layer in the 1-2$^{th}$ power connection line in the first direction may be greater than a length of the first conductive layer in the 1-2$^{th}$ power connection line in the first direction, and a length of the second conductive layer in each of the second power connection lines in the first direction may be greater than a length of the first conductive layer in each of the second power connection lines in the first direction.

The display apparatus may further include a second power input line on end portions of the second power connection lines in a direction away from the display area and electrically connected to each of the first conductive layer and the second conductive layer in each of the second power connection lines.

The display apparatus may further include a second power transfer line on end portions of the second power connection lines in a direction to the display area and electrically connected to each of the first conductive layer and the second conductive layer in each of the second power connection lines.

Each of the second power connection lines may further include a third conductive layer on a third insulating layer.

The second insulating layer may be under the first insulating layer, and the third insulating layer may be under the second insulating layer.

The second insulating layer may cover the third conductive layer in each of the second power connection lines, and the first insulating layer may cover the second conductive layer in the 1-2$^{th}$ power connection line and the second conductive layer in each of the second power connection lines.

The first conductive layer, the second conductive layer, and the third conductive layer in each of the second power connection lines may overlap one another when viewed in a direction perpendicular to the substrate.

A length of the second conductive layer in each of the second power connection lines in the first direction may be greater than a length of the first conductive layer in each of the second power connection lines in the first direction, and a length of the third conductive layer in each of the second power connection lines in the first direction may be greater than the length of the second conductive layer in each of the second power connection lines in the first direction.

The display apparatus may further include a second power input line on end portions of the second power connection lines in a direction away from the display area and electrically connected to each of the first conductive layer, the second conductive layer, and the third conducive layer in each of the second power connection lines.

The display apparatus may further include a second power transfer line on end portions of the second power connection lines in a direction to the display area and electrically connected to each of the first conductive layer, the second conductive layer, and the third conductive layer in each of the second power connection lines.

The second power transfer line may extend along the second edge and may be electrically connected to a common electrode of pixels arranged in the display area.

The display apparatus may further include: a display element in the display area; and an encapsulation layer covering the display element and including an inorganic encapsulation layer and an organic encapsulation layer on the inorganic encapsulation layer. The inorganic encapsulation layer may be in direct contact with the first power connection line or may be in direct contact with an inorganic insulating layer covering the first power connection line.

These and/or other aspects and features of the present disclosure will become apparent and more readily appreciated from the following detailed description of embodiments, the accompanying drawings, and claims.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1:
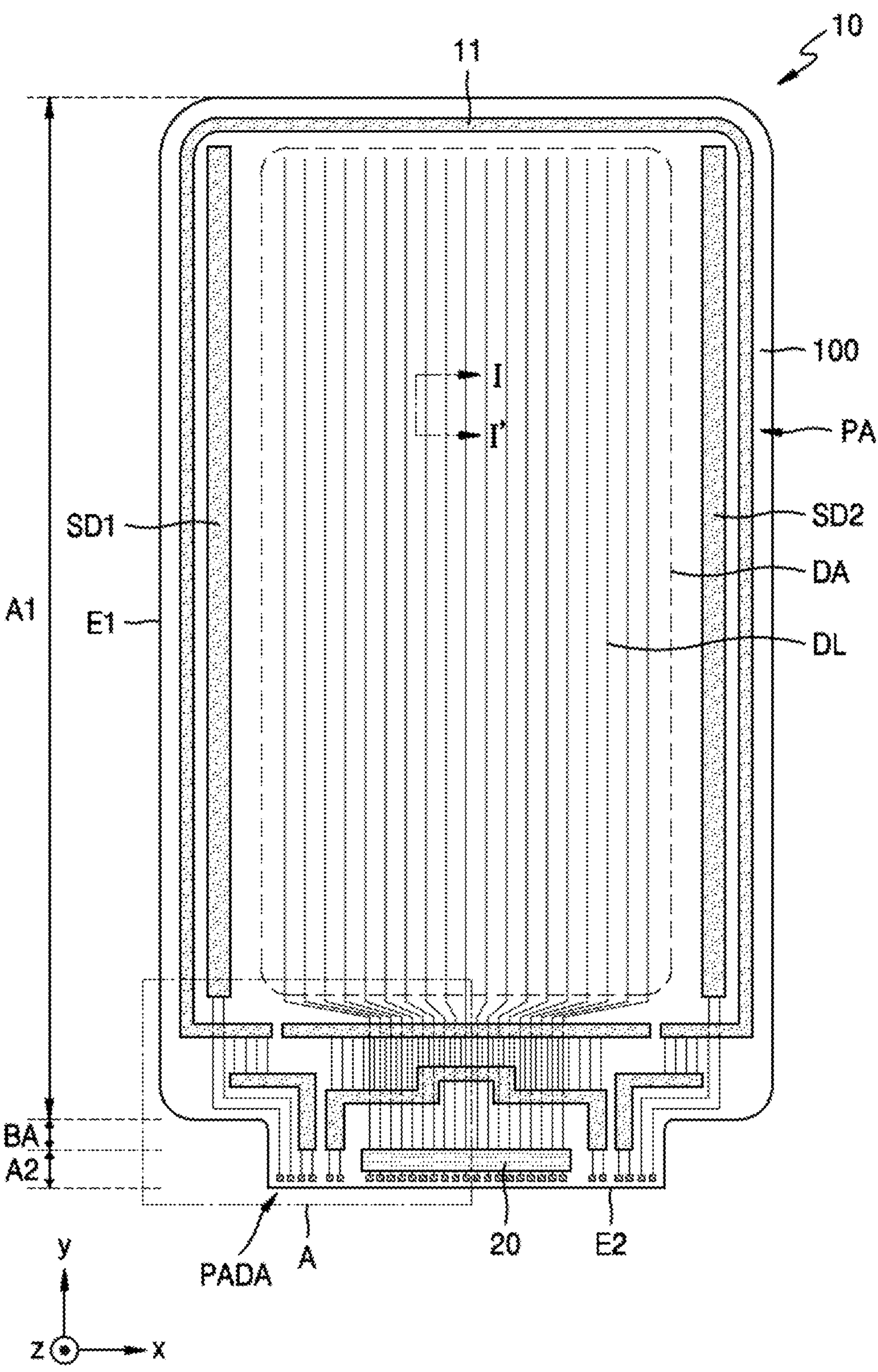
FIG. 1 is a schematic plan view of a display apparatus according to an embodiment.

Reference will now be made, in detail, to embodiments, examples of which are illustrated in the accompanying drawings. The described embodiments may have different forms and should not be construed as being limited to the descriptions set forth herein. Accordingly, embodiments are merely described below, by referring to the figures, to explain aspects and features of the present description.

As the present disclosure allows for various changes and numerous embodiments, certain embodiments will be illustrated in the drawings and described in the written description. Aspects and features of the present disclosure, and methods for achieving them, will be clarified with reference to embodiments described below in detail with reference to the drawings. However, the present disclosure is not limited to the following embodiments and may be embodied in various forms.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The x-axis, the y-axis, and the z-axis are not limited to three axes of the rectangular coordinate system and may be interpreted in a broader sense. For example, the x-axis, the y-axis, and the z-axis may be perpendicular to one another or may represent different orientations that are not perpendicular to one another.

Hereinafter, embodiments of the present disclosure will be described with reference to the accompanying drawings.

FIG. 1 is a schematic plan view of a display apparatus according to an embodiment.

The display apparatus, according to an embodiment, may include a display panel 10 as shown in FIG. 1. As long as the display apparatus includes the display panel 10, any display apparatus may be used. As an example, the display apparatus may be various products, such as smartphones, tablet computers, laptop computers, televisions, advertisement boards, or the like.

The display panel 10 has a display area DA and a peripheral area PA outside the display area DA. A plurality of pixels are arranged in the display area DA. It may be understood that a substrate 100 included in the display apparatus has (or defines) the display area DA and the peripheral area PA. The peripheral area PA includes a pad area PADA, which is a region in which an electronic element, such as a driving chip 20 or a printed circuit board and the like are electrically attached. In addition, a first scan driving circuit SD1, a second scan driving circuit SD2, a common voltage supply line 11, and the like may be arranged in the peripheral area PA.

The driving chip 20 may include an integrated circuit configured to drive the display panel 10. Although the integrated circuit is described as being a data driving integrated circuit configured to generate data signals in this embodiment, the present disclosure is not limited thereto. The driving chip 20 may be mounted in the peripheral area PA and adjacent to a second edge E2 of the substrate 100.

FIG. 1 may be understood as a plan view of the substrate 100 and the like during the manufacturing process. In electronic apparatuses, such as display apparatuses, smartphones including display apparatuses, and the like, a portion of the substrate 100 and the like may be bent to reduce the area of the peripheral area PA recognized by a user. As an example, the peripheral area PA includes a bending area BA arranged between the pad area PADA and the display area DA. In such an embodiment, the substrate 100 is bent at the bending area BA such that a first area A1 arranged on one side of the bending area BA overlaps a second area A2 arranged on another side of the bending area BA. As an example, the substrate 100 is bent at the bending area BA such that at least a portion of the pad area PADA overlaps the display area DA. In such an embodiment, the pad area PADA does not hide (or cover) the display area DA but a bending direction is such that the pad area PADA is arranged behind (or under) the display area DA. Accordingly, a user recognizes that the display area DA occupies most of the display apparatus. The driving chip 20 is disposed on the same surface as a display surface of the display area DA, but, because the display panel 10 is bent at the bending area BA, the driving chip 20 may be disposed on (or behind) the rear surface of the display area DA.

When the substrate 100 is flexible or bendable, the substrate 100 may include, for example, a polymer resin including polyethersulphone, polyacrylate, polyetherimide, polyethylene naphthalate, polyethylene terephthalate, polyphenylene sulfide, polyarylate, polyimide, polycarbonate, and cellulose acetate propionate. The substrate 100 may have a multi-layered structure including two layers, each including the polymer resin, and a barrier layer including an inorganic material, such as silicon oxide, silicon nitride, and silicon oxynitride, therebetween. However, various modifications may be made. Furthermore, when the substrate 100 is not bent, the substrate 100 may include glass and the like.

An edge (e.g., an entire edge) of the display area DA may have a shape similar to a rectangle or a square. Accordingly, the substrate 100 (e.g., the entire substrate) may have a shape similar to a rectangle or a square. In other embodiments, however, the edge of the display area DA may have a circular shape, an elliptical shape, or a polygonal shape.

As shown in FIG. 1, the substrate 100 may have a first edge E1 and a second edge E2. The first edge E1 extends in a first direction (e.g., a y axis direction), and the second edge E2 extends in a second direction (e.g., an x axis direction) crossing the first direction. The pad area PADA may be a portion of the peripheral area PA of the substrate 100 adjacent to the second edge E2. In some embodiments, the substrate 100 may have a bent portion between the first edge E1 and the second edge E2 such that bending of the substrate 100 and the like may be easily performed at the bending area BA. Accordingly, as shown in FIG. 1, the width of the second area A2 in the second direction (e.g., the x axis direction) may be less than the width of the first area A1 in the second direction (e.g., the x axis direction).

Hereinafter, an organic light-emitting display apparatus is described as an example of the display apparatus according to an embodiment, but the display apparatus is not limited thereto. In another embodiment, the display apparatus according to an embodiment may be an inorganic light-emitting display apparatus or a quantum-dot light-emitting display apparatus. As an example, an emission layer of a display element of the display apparatus may include an organic material or an inorganic material. In addition, the display apparatus may include an emission layer and quantum-dots disposed along a path of light emitted from the emission layer.

A plurality of pixels are arranged in the display area DA. Each of the pixels may denote a sub-pixel and may include a display element, such as an organic light-emitting diode OLED and a pixel circuit electrically connected to the display element. The pixel may be configured to emit, for example, red, green, blue, or white light. The pixel may be electrically connected to outer circuits arranged in the peripheral area PA. The first scan driving circuit SD1, the second scan driving circuit SD2, and the common voltage supply line 11 may be arranged in the peripheral area PA.

The first scan driving circuit SD1 may extend along the first edge E1 of the substrate 100. The first scan driving circuit SD1 may be configured to provide scan signals to pixels through a scan line extending in the second direction (e.g., the x axis direction) into the display area DA. The second scan driving circuit SD2 may be arranged symmetrical with the first scan driving circuit SD1 with the display area DA therebetween. Some of the pixels arranged in the display area DA may be electrically connected to the first scan driving circuit SD1, and the others may be electrically connected to the second scan driving circuit SD2. In some embodiments, the second scan driving circuit SD2 may be omitted, and in which case, all of the pixels arranged in the display area DA may be electrically connected to the first scan driving circuit SD1.

An emission control driving circuit and the like may be arranged on the side of the first scan driving circuit SD1 or the second scan driving circuit SD2. An emission control signal and the like may be provided to the pixel through an emission control line and the like that are approximately parallel to the scan line.

A plurality of pads PD1, PD2, PD3, and PD4 (see, e.g., FIG. 2) may be arranged in the pad area PADA of the display panel 10. The plurality of pads PD1, PD2, PD3, and PD4 may be exposed and electrically connected to a printed circuit board by not being covered by (e.g., by being exposed through) an insulating layer. For example, pads of the printed circuit board may be electrically connected to the plurality of pads PD1, PD2, PD3, and PD4 of the display panel 10.

The printed circuit board is configured to transfer signals of a controller or power to the display panel 10. Control signals generated by the controller may be transferred to the driving chip 20, the first scan driving circuit SD1, the second scan driving circuit SD2 and the like through the printed circuit board. In addition, the controller may be configured to provide a common voltage ELVSS to the common voltage supply line 11 and to provide a driving voltage ELVDD to driving power lines extending in the first direction (e.g., the y axis direction) and extending into the display area DA. Detailed descriptions thereof are provided below. For reference, the common voltage supply line 11 may have a loop shape having one open side in a direction toward the second edge E2 and, thus, has a shape partially surrounding (e.g., partially surrounding a periphery of) the display area DA.

The controller may be configured to generate data signals, and the generated data signals may be transferred to the pixel through the driving chip 20 and a data line DL.

Figure 2:
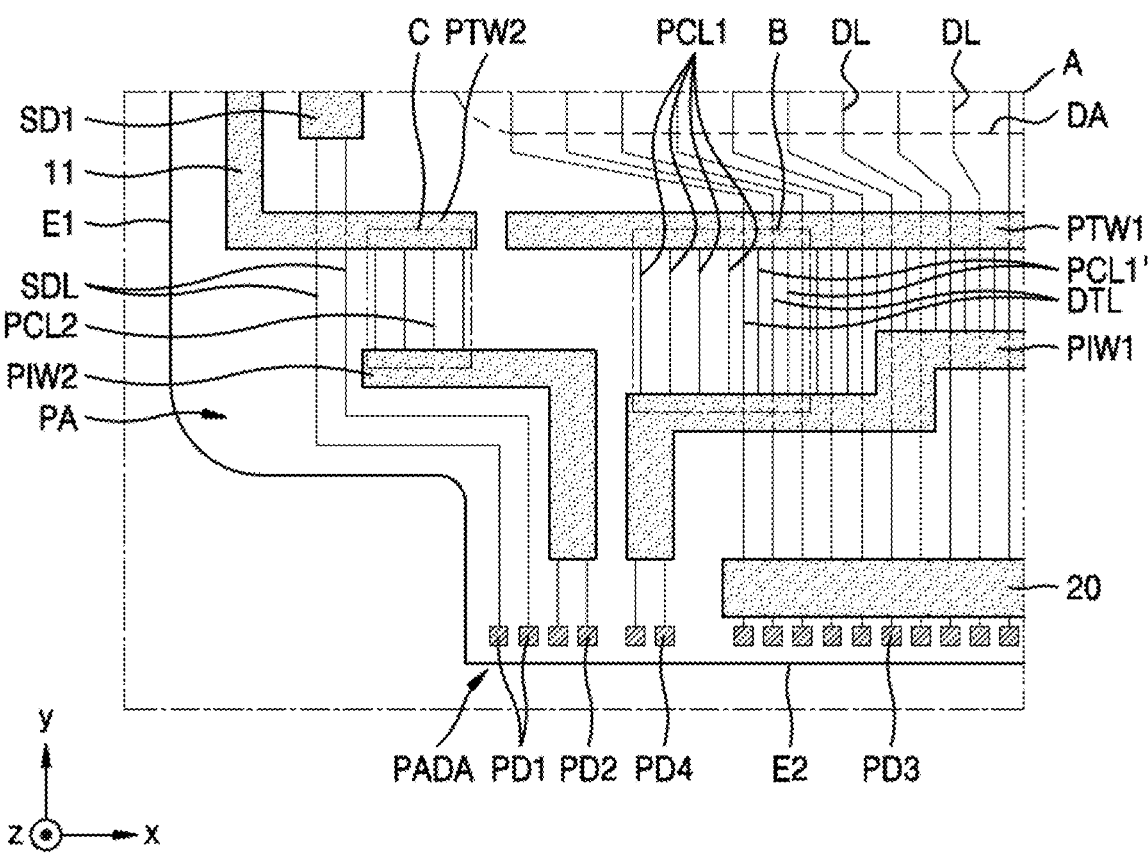
FIG. 2 is an enlarged view of the region A in FIG. 1.
Figure 3:
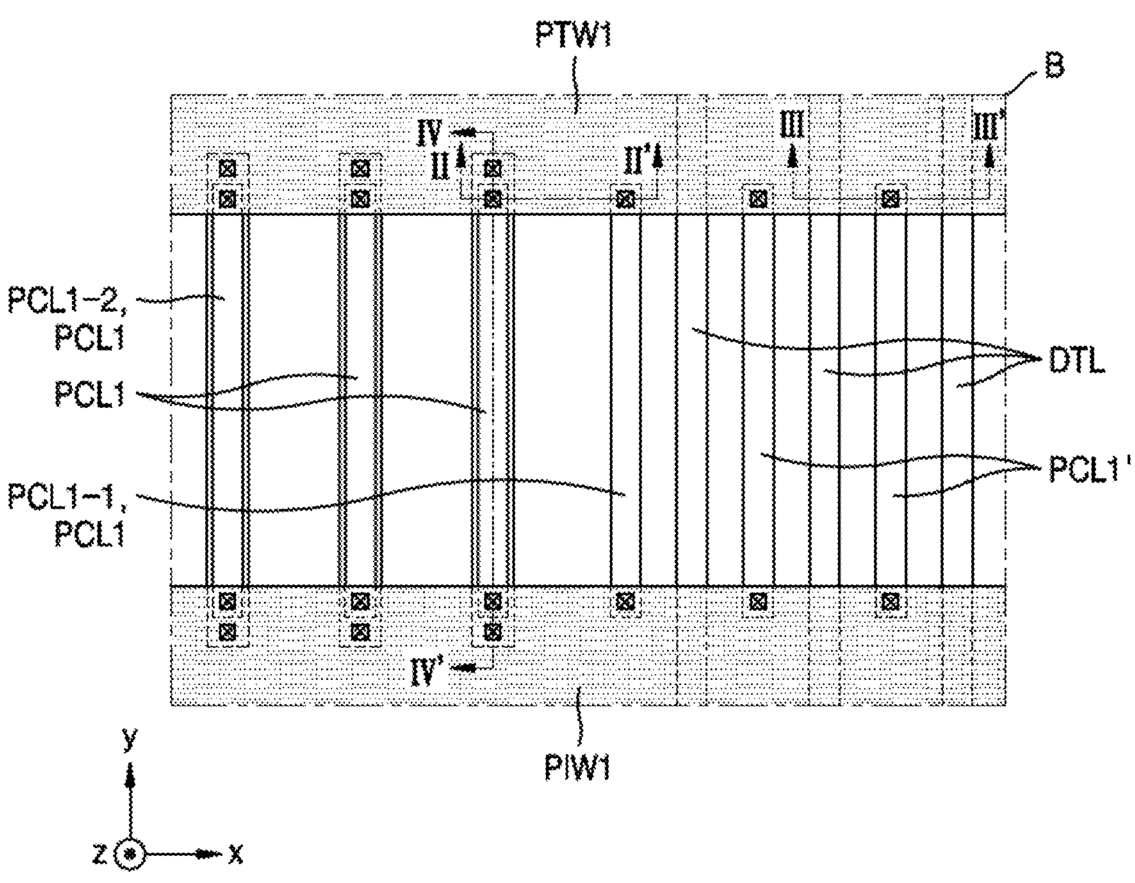
FIG. 3 is an enlarged view of the region B in FIG. 2.
Figure 4:
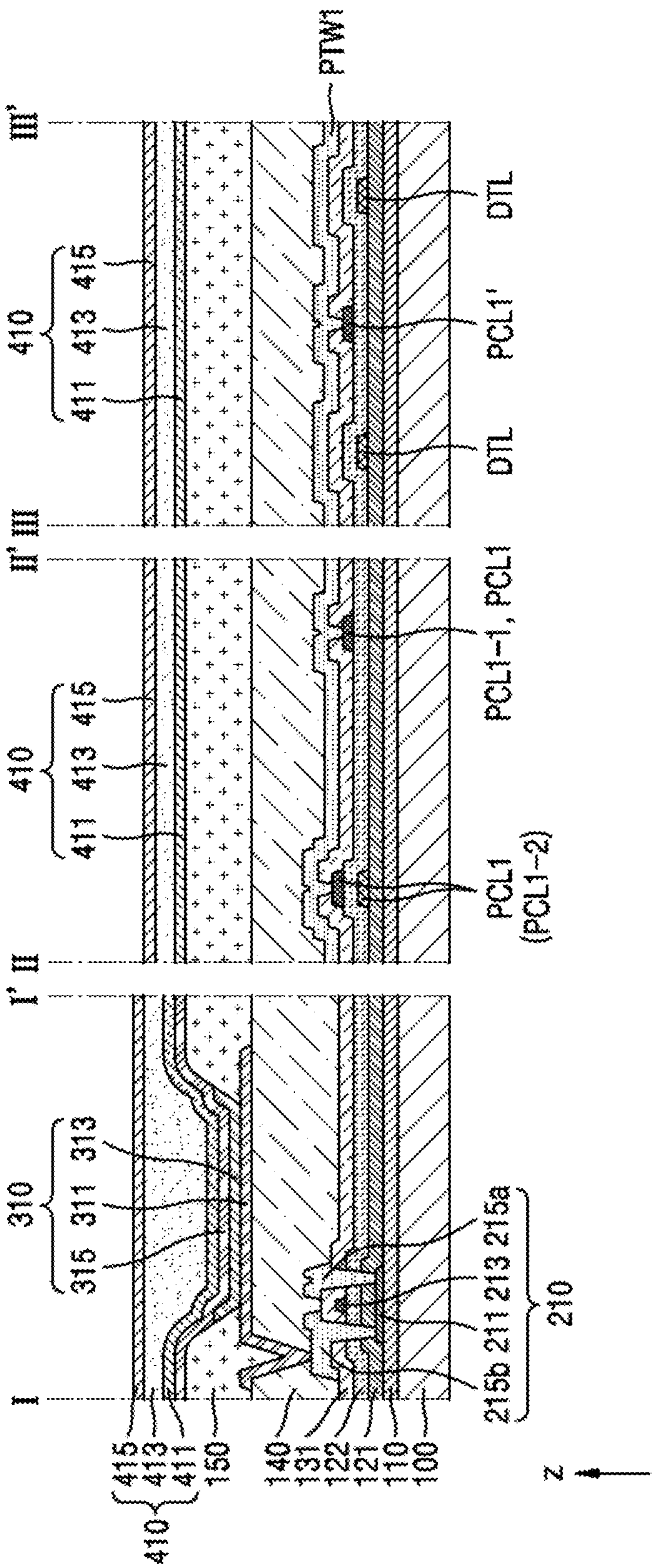
FIG. 4 is a schematic cross-sectional view of the display apparatus shown in FIG. 1 taken along the line I-I' of FIG. 1, the line II-II' of FIG. 3, and the line III-III' of FIG. 3.
Figure 5:
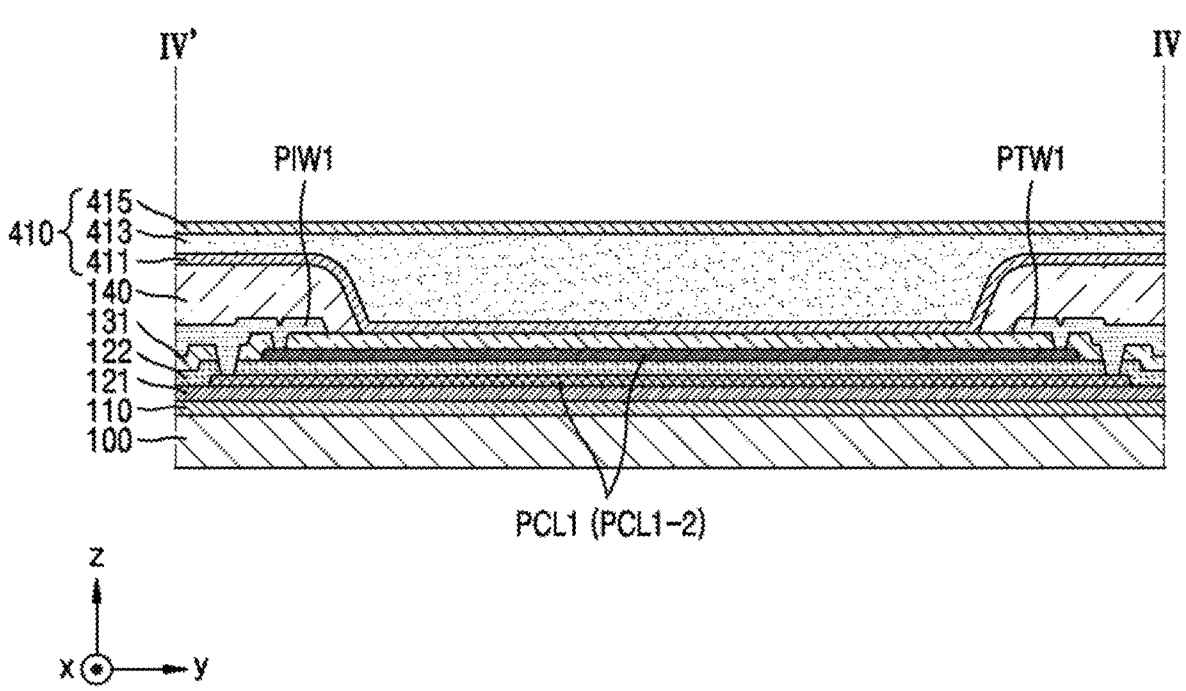
FIG. 5 is a schematic cross-sectional view of the display apparatus shown in FIG. 1 taken along the line IV-IV' of FIG. 3.
Figure 6:
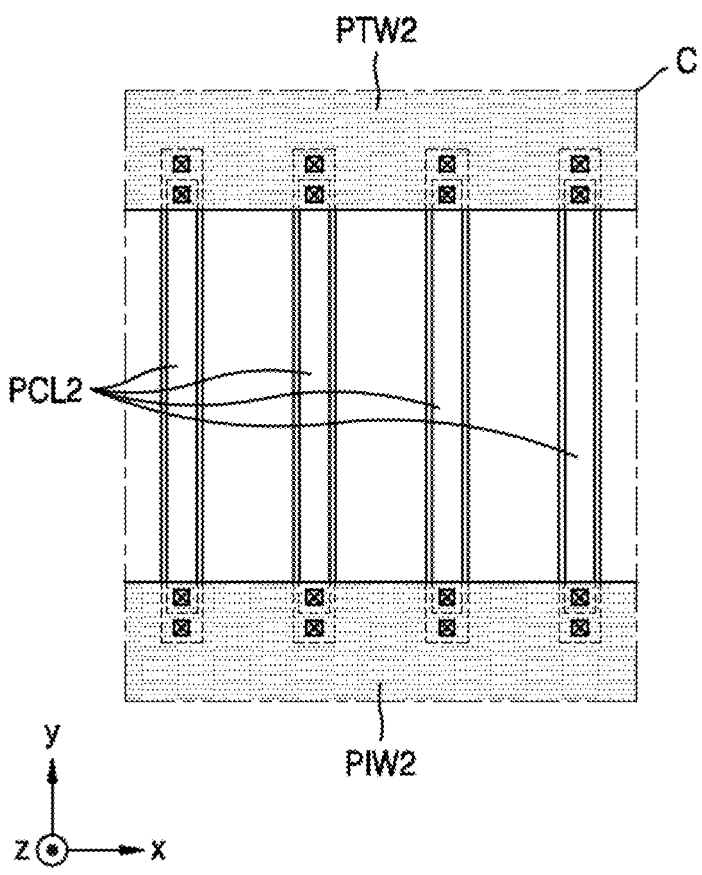
FIG. 6 is an enlarged view of the region C in FIG. 2.

FIG. 2 is an enlarged view of the region A in FIG. 1, FIG. 3 is an enlarged view of the region B of FIG. 2, FIG. 4 is a schematic cross-sectional view of the display apparatus shown in FIG. 1 taken along the line I-I' of FIG. 1, the line II-II' of FIG. 3, and the line III-III' of FIG. 3, FIG. 5 is a schematic cross-sectional view of the display apparatus shown in FIG. 1 taken along the line IV-IV' of FIG. 3, and FIG. 6 is an enlarged view of the region C of FIG. 2.

As shown in FIG. 2, the first pad PD1, the second pad PD2, the third pad PD3, the fourth pad PD4, and the like are arranged near the second edge E2 of the substrate 100.

A scan driving circuit line SDL may be arranged in the peripheral area PA and adjacent to the second edge E2 and may be electrically connected to the first scan driving circuit SD1 and the first pad PD1. Accordingly, a control signal input from the printed circuit board through the first pad PD1 may be transferred to the first scan driving circuit SD1 through the scan driving circuit line SDL.

A data signal of the controller input from the printed circuit board through the third pad PD3 may be transferred to data lines DL in the display area DA through the driving chip 20 and data transfer lines DTL and then finally transferred to the pixels. To this end, the data transfer lines DTL may, for example, be adjacent to the second edge E2 of the substrate 100 and may be arranged in the peripheral area PA. In addition, each of the data transfer lines DTL may extend in the first direction (e.g., the y axis direction).

A first power input line PIW1 arranged in the peripheral area PA and adjacent to the second edge E2 of the substrate 100 may have a first portion and a second portion. The first portion extends in approximately the second direction (e.g., the x axis direction), and the second portion protrudes from the first portion and extends in the first direction (e.g., the y axis direction). The second portion of the first power input line PIW1 may be electrically connected to the fourth pad PD4. For reference, the first portion of the first power input line PIW1 may be bent a plurality of times, as shown in FIG. 2. While it is shown in FIG. 2 that the first portion of the first power input line PIW1 is bent twice, the present disclosure is not limited thereto.

A plurality of driving power lines extending in the first direction (e.g., the y axis direction) and extending into the display area DA may be electrically connected to a first power transfer line PTW1 extending in the second direction (e.g., the x axis direction) along the second edge E2 and approximately parallel to the first portion of the first power input line PIW1. A plurality of driving power lines may be approximately parallel to the plurality of data lines DL within the display area DA.

First power connection lines PCL1 may extend in the first direction (e.g., the y axis direction) to electrically connect the first power input line PIW1 to the first power transfer line PTW1. As shown in FIGS. 2 and 3, the first power connection lines PCL1 may be arranged in the peripheral area PA and adjacent to the second edge E2 of the substrate 100 to correspond to a space between the data transfer lines DTL and the first edge E1 of the substrate 100 in the second direction (e.g., the x axis direction).

As shown in FIG. 5, the end portion of the first power connection line PCL1 in a direction (e.g., a −y direction) away from the display area DA (e.g., in a direction opposite to the direction of the display area DA) may be disposed below the first power input line PIW1 and electrically connected to the first power input line PIW1 through a contact hole (e.g., a contact opening) formed in an insulating layer thereon. In addition, the end portion of the first power connection line PCL1 in a direction (e.g., a +y direction) of the display area DA may be disposed below the first power transfer line PTW1 and electrically connected to the first power transfer line PTW1 through a contact hole (e.g., a contact opening) formed in the insulating layer thereon. Accordingly, the driving voltage ELVDD input from the printed circuit board through the fourth pad PD4 may be transferred to the driving power lines through the first power input line PIW1, the first power connection line PCL1, and the first power transfer line PTW1, and as a result, the driving voltage ELVDD may be applied to each pixel electrically connected to the driving power lines.

As shown in FIGS. 3, 4, and 5, a 1-$1^{th}$ power connection line PCL1-1 that is most adjacent to (e.g., is nearest to) the data transfer lines DTL from among the first power connection lines PCL1 may include a first conductive layer on a first insulating layer, and a 1-$2^{th}$ power connection line PCL1-2 that is farthest away from the data transfer lines DTL from among the first power connection lines PCL1 may include a first conductive layer on the first insulating layer and a second conductive layer on a second insulating layer. That is, the 1-$1^{th}$ power connection line PCL1-1 may have a single-layer structure, and the 1-$2^{th}$ power connection line PCL1-2 may have a multi-layer structure including the conductive layers that are spaced apart from each other vertically.

At least some of the first power connection lines PCL1 other than the 1-$1^{th}$ power connection line PCL1-1 and the 1-$2^{th}$ power connection line PCL1-2 may have the same multi-layer structure as the 1-$2^{th}$ power connection line PCL1-2. It is shown in FIGS. 3, 4, and 5 that all of the first power connection lines PCL1 other than the 1-$1^{th}$ power connection line PCL1-1 and the 1-$2^{th}$ power connection line PCL1-2 each have the same configuration as the 1-$2^{th}$ power connection line PCL1-2, but this is merely an example and the present disclosure is not limited thereto. Hereinafter, an embodiment in which all of the first power connection lines PCL1 other than the 1-$1^{th}$ power connection line PCL1-1 and the 1-$2^{th}$ power connection line PCL1-2 each have the same configuration as the 1-$2^{th}$ power connection line PCL1-2 is described as an example.

The first insulating layer may be, for example, a second gate insulating layer 122, described below, and the second insulating layer may be a first gate insulating layer 121, described below. The first gate insulating layer 121 may be disposed below the second gate insulating layer 122. Accordingly, the second gate insulating layer 122, which is the first insulating layer, may cover the second conductive layer disposed on the first gate insulating layer 121, which is the second insulating layer, from among the first conductive layer and the second conductive layer of the 1-$2^{th}$ power connection line PCL1-2. The first conductive layer of the 1-$2^{th}$ power connection line PCL1-2 may be disposed on the second conductive layer of the 1-$2^{th}$ power connection line PCL1-2.

As shown in FIG. 3, when viewed in a direction perpendicular to the substrate 100 (e.g., a z axis direction or a plan view), the first conductive layer and the second conductive layer of the 1-$2^{th}$ power connection line PCL1-2 may overlap each other. For example, when viewed in the direction perpendicular to the substrate 100 (e.g., the z axis direction), the first conductive layer of the 1-$2^{th}$ power connection line PCL1-2 may overlap the second conductive layer of the 1-$2^{th}$ power connection line PCL1-2 because the length of the second conductive layer included in the 1-$2^{th}$ power connection line PCL1-2 in the first direction (e.g., the y axis direction) is greater than the length of the first conductive layer included in the 1-$2^{th}$ power connection line PCL1-2 in the first direction (e.g., the y axis direction).

The first power input line PIW1 is electrically connected to the first conductive layer of the 1-$1^{th}$ power connection line PCL1-1. In addition, the first power input line PIW1 is electrically connected to each of the first conductive layer and the second conductive layer of the 1-$2^{th}$ power connection line PCL1-2. For example, in each of the first conductive layer of the 1-$1^{th}$ power connection line PCL1-1 and the first conductive layer of the 1-$2^{th}$ power connection line PCL1-2, each of which extend in the first direction (e.g., the y axis direction), the end portion in a direction (e.g., the −y direction) opposite to a direction to the display area DA is disposed below the first power input line PIW1 and is electrically connected to the first power input line PIW1 through a contact hole (e.g., a contact opening) formed in the insulating layer thereon. In addition, in the second conductive layer of the 1-$2^{th}$ power connection line PCL1-2 extending in the first direction (e.g., the y axis direction), the end portion in a direction (e.g., the −y direction) opposite to a direction to the display area DA is disposed below the first power input line PIW1 and is electrically connected to the first power input line PIW1 through a contact hole (e.g., a contact opening) formed in the insulating layers thereon. When viewed in a direction (e.g., the z axis direction) perpendicular to the substrate 100, the end portion in the direction (e.g., the −y direction) opposite to the direction to the display area DA of the second conductive layer of the 1-$2^{th}$ power connection line PCL1-2 may be closer to the second edge E2 than the end portion in the direction (e.g., the −y direction) opposite to the direction to the display area DA of the first conductive layer of the 1-$2^{th}$ power connection line PCL1-2 (e.g., the second conductive layer of the 1-2$^{th}$ power connection line PCL1-2 may extend beyond the first conductive layer of the 1-2$^{th}$ power connection line PCL1-2 in a direction toward the second edge E2).

The first power transfer line PTW1 is electrically connected to the first conductive layer of the 1-1$^{th}$ power connection line PCL1-1. In addition, the first power transfer line PTW1 is electrically connected to each of the first conductive layer and the second conductive layer of the 1-2$^{th}$ power connection line PCL1-2. For example, in each of the first conductive layer of the 1-1$^{th}$ power connection line PCL1-1 and the first conductive layer of the 1-2$^{th}$ power connection line PCL1-2, each of which extends in the first direction (e.g., the y axis direction), the end portion in a direction (e.g., the +y direction) toward the display area DA is disposed below the first power transfer line PTW1 and is electrically connected to the first power transfer line PTW1 through a contact hole (e.g., a contact opening) formed in the insulating layer thereon. In addition, in the second conductive layer of the 1-2$^{th}$ power connection line PCL1-2, which extends in the first direction (e.g., the y axis direction), the end portion in a direction (e.g., the +y direction) toward the display area DA is disposed below the first power transfer line PTW1 and is electrically connected to the first power transfer line PTW1 through a contact hole (e.g., a contact opening) formed in the insulating layers thereon. When viewed in a direction (e.g., the z axis direction) perpendicular to the substrate 100, the end portion in the direction (e.g., the +y direction) toward the display area DA of the second conductive layer of the 1-2$^{th}$ power connection line PCL1-2 may be closer to the display area DA than the end portion in the direction (e.g., the +y direction) toward the display area DA of the first conductive layer of the 1-2$^{th}$ power connection line PCL1-2.

As described above, the driving voltage ELVDD input from the printed circuit board through the fourth pad PD4 may be transferred to the driving power lines through the first power input line PIW1, the first power connection line PCL1, and the first power transfer line PTW1, and as a result, the driving voltage ELVDD may be applied to each pixel electrically connected to the driving power lines. In such an embodiment, because the 1-2$^{th}$ power connection line PCL1-2 and the like included in the first power connection line PCL1 have a multi-layer structure including the first conductive layer and the second conductive layer, as described above, a voltage drop (or IR drop) due to resistance may be prevented or reduced in transferring the driving voltage ELVDD.

The 1-1$^{th}$ power connection line PCL1-1, which is most adjacent to (or nearest to) the data transfer lines DTL from among the first power connection lines PCL1 may include only the first conductive layer as described above. As shown in FIG. 4, the data transfer lines DTL may be disposed on the same layer as the second conductive layer of the 1-2$^{th}$ power connection line PCL1-2. That is, the data transfer lines DTL may be disposed on the first gate insulating layer 121, which is the second insulating layer. Accordingly, if the 1-1$^{th}$ power connection line PCL1-1 includes the second conductive layer disposed on the second insulating layer in addition to the first conductive layer, a short-circuit may occur between the 1-1$^{th}$ power connection line PCL1-1 and the data transfer line DTL adjacent thereto during the manufacturing process. For example, when the number of data transfer lines DTL is increased to implement a high-resolution display apparatus, an interval (or spacing) between the 1-1$^{th}$ power connection line PCL1-1 and the data transfer line DTL adjacent thereto narrows and a possibility that a short-circuit occurs therebetween may increase. Accordingly, to prevent such an issue from occurring, the 1-1$^{th}$ power connection line PCL1-1 that is most adjacent to the data transfer lines DTL from among the first power connection lines PCL1 may include only the first conductive layer, as described above.

As shown in FIGS. 2 and 3, a power connection auxiliary line PCL1' may be arranged between (e.g., between adjacent ones of) the data transfer lines DTL. The power connection auxiliary lines PCL1' may extend in the first direction (e.g., the y axis direction) to electrically connect the first power input line PIW1 to the first power transfer line PTW1. For example, as shown in FIG. 3, the end portion of the power connection auxiliary line PCL1' in a direction (e.g., a −y direction) away from the display area DA (e.g., in a direction opposite to a direction toward the display area DA) may be disposed below the first power input line PIW1 and electrically connected to the first power input line PIW1 through a contact hole (e.g., a contact opening) formed in an insulating layer thereon. In addition, as shown in FIGS. 3 and 4, the end portion of the power connection auxiliary line PCL1' in a direction (e.g., the +y direction) toward the display area DA may be disposed below the first power transfer line PTW1 and electrically connected to the first power transfer line PTW1 through a contact hole (e.g., a contact opening) formed in an insulating layer thereon.

Similarly, the first power input line PIW1 may be electrically connected to the first power transfer line PTW1 through not only the first power connection line PCL1 but also the power connection auxiliary line PCL1'. Accordingly, the driving voltage ELVDD input from the printed circuit board through the fourth pad PD4 may be swiftly and efficiently transferred to the first power transfer line PTW1.

In addition, the power connection auxiliary line PCL1' may not be used and only the first power connection line PCL1 may be used. When viewed in the direction (e.g., the z axis direction) perpendicular to the substrate 100, the width of the first power connection line PCL1 may be widened or the number of the first power connection lines PCL1 may be increased. However, because the area in which the data transfer lines DTL are arranged in a plan view inevitably increases to implement a high-resolution display apparatus, it may not be easy to widen the width of the first power connection line PCL1 or increase the number of the first power connection lines PCL1. Because the display apparatus according to an embodiment includes the power connection auxiliary line PCL1' arranged between the plurality of data transfer lines DTL and electrically connecting the first power input line PIW1 to the first power transfer line PTW1, the driving voltage ELVDD may be swiftly and efficiently transferred from the first power input line PIW1 to the first power transfer line PTW1.

Because the power connection auxiliary line PCL1' is arranged on the same layer as the data transfer line DTL, the power connection auxiliary line PCL1' may be arranged between the data transfer lines DTL and may have an isolated shape (e.g., may be isolated or insulated from the data transfer lines DTL). In addition, to prevent a short-circuit from occurring between the power connection auxiliary line PCL1' and the data transfer line DTL, the power connection auxiliary line PCL1' may have the same layered structure as the 1-1$^{th}$ power connection line PCL1-1 as shown in the region II-II' and the region III-III' of FIG. 4.

As shown in FIG. 4, the display apparatus according to an embodiment may include a display element, such as an organic light-emitting element 310, arranged in the display area DA and a thin-film transistor 210 arranged in the display area DA and electrically connected to the organic light-emitting element 310 to control whether or not the organic light-emitting element 310 emits light and the degree of light emission of the organic light-emitting element 310. When the organic light-emitting element 310 is electrically connected to the thin-film transistor 210, it may be understood that a pixel electrode 311 of the organic light-emitting element 310 is electrically connected to the thin-film transistor 210.

The thin-film transistor 210 may include a semiconductor layer 211, a gate electrode 213, a source electrode 215*a*, and a drain electrode 215*b*. The semiconductor layer 211 includes amorphous silicon, polycrystalline silicon, or an organic semiconductor material. The gate electrode 213 may include various suitable conductive materials and may have various layered structures including, for example, a Mo layer and an Al layer. In one embodiment, the gate electrode 213 may include a first metal layer including titanium or aluminum and a second metal layer disposed on the first metal layer and including molybdenum. The source electrode 215*a* and the drain electrode 215*b* may also include various suitable conductive materials and various layered structures and may include, for example, a Ti layer and an Al layer. In one embodiment, the source electrode 215*a* and the drain electrode 215*b* may each include a first metal layer, a second metal layer, and a third metal layer in which the first metal layer includes titanium, the second metal layer is disposed on the first metal layer and includes aluminum, and the third metal layer is disposed on the second metal layer and includes titanium.

To insulate the semiconductor layer 211 and the gate electrode 213 from each other, the first gate insulating layer 121 may be disposed between the semiconductor layer 211 and the gate electrode 213. The first gate insulating layer 121 includes an inorganic material, such as silicon oxide, silicon nitride, and/or silicon oxynitride. As described above, the first gate insulating layer 121 may be the second insulating layer. The second gate insulating layer 122 may be disposed between the first gate insulating layer 121 and the gate electrode 213, and the second gate insulating layer 122 includes an inorganic material, such as silicon oxide, silicon nitride, and/or silicon oxynitride. As described above, the second gate insulating layer 122 may be the first insulating layer. Wirings and the like may be disposed between the first gate insulating layer 121 and the second gate insulating layer 122. The wirings may also include various suitable conductive materials and may have various layered structures including, for example, a Mo layer and an Al layer. In one embodiment, the wiring between the first gate insulating layer 121 and the second gate insulating layer 122 may include a first metal layer including titanium or aluminum and a second metal layer disposed on the first metal layer and including molybdenum.

In addition, an interlayer insulating layer 131 may be disposed on the gate electrode 213 and the second gate insulating layer 122 and may include an inorganic material, such as silicon oxide, silicon nitride, and/or silicon oxynitride. The source electrode 215*a* and the drain electrode 215*b* may be disposed on the interlayer insulating layer 131. The insulating layer(s) including the inorganic material may be formed by chemical vapor deposition (CVD) or atomic layer deposition (ALD) to include silicon oxide, silicon nitride, or silicon oxynitride. This is also applicable to embodiments below and modifications thereof.

The first power input line PIW1 and/or the first power transfer line PTW1 may each be arranged on the same layer as the source electrode 215*a* and/or the drain electrode 215*b*. For example, the first power input line PIW1 and/or the first power transfer line PTW1 may each be disposed on the interlayer insulating layer 131. The first power input line PIW1 and/or the first power transfer line PTW1 may include the same material as the source electrode 215*a* and/or the drain electrode 215*b* and may be formed concurrently (or simultaneously) therewith and may have the same layered structure as the source electrode 215*a* and/or the drain electrode 215*b*. This is also applicable to a second power input line PIW2 and/or a second power transfer line PTW2, described below.

Similarly, the first conductive layer of the 1-1$^{th}$ power connection line PCL1-1 and/or the first conductive layer of the 1-2$^{th}$ power connection line PCL1-2 may be arranged on the same layer as the gate electrode 213. For example, the first conductive layer of the 1-1$^{th}$ power connection line PCL1-1 and/or the first conductive layer of the 1-2$^{th}$ power connection line PCL1-2 may be disposed on the second gate insulating layer 122. The first conductive layer of the 1-1$^{th}$ power connection line PCL1-1 and/or the first conductive layer of the 1-2$^{th}$ power connection line PCL1-2 may include the same material as the gate electrode 213 and be formed concurrently (or simultaneously) therewith and may have the same layered structure as the gate electrode 213. This is also applicable to the first conductive layer of the second power connection line PCL2, described below.

The second conductive layer of the 1-2$^{th}$ power connection line PCL1-2 may include the same material as the gate electrode 213 and may have the same layered structure as the gate electrode 213. This is also applicable to the second conductive layer of the second power connection line PCL2, described below.

For reference, the source electrode 215*a* and the drain electrode 215*b* may not act as electrodes but may be simple metal layers. As an example, a portion of the semiconductor layer 211 may be doped to act as a source electrode or a drain electrode. In such an embodiment, the source electrode 215*a* and the drain electrode 215*b* shown in FIG. 4 act as connection electrodes electrically connecting the semiconductor layer 211 to other elements. In other embodiments, the source electrode 215*a* or the drain electrode 215*b* shown in FIG. 4 may be a portion of a wiring and may not be in contact with the semiconductor layer 211. However, various modifications may be made thereto. In this meaning, the source electrode 215*a* or the drain electrode 215*b* may be referred to as metal layers arranged in the display area DA. This is also applicable to embodiments below and modifications thereof.

The thin-film transistor 210 does not necessarily include both the source electrode 215*a* or the drain electrode 215*b*. A pixel circuit to which the organic light-emitting element 310 is electrically connected may include a plurality of thin-film transistors and a capacitor. Accordingly, in an embodiment in which a drain electrode of a thin-film transistor is connected to a source electrode of another thin-film transistor, the thin-film transistor may not include a drain electrode, the other thin-film transistor may not include a source electrode, and a drain region of the semiconductor layer of the thin-film transistor and a source region of the semiconductor layer of the other thin-film transistor may be integrally formed.

A buffer layer 110 may be disposed between the thin-film transistor 210 having the above-described structure and the substrate 100. The buffer layer 110 includes an inorganic material, such as silicon oxide, silicon nitride, and/or silicon oxynitride. The buffer layer 110 may increase flatness of (e.g., may planarize) the upper surface of the substrate 100 and/or prevent or reduce impurities in the substrate 100 from penetrating into the semiconductor layer 211 of the thin-film transistor 210.

A planarization layer 140 may be disposed on the thin-film transistor 210 and the interlayer insulating layer 131. As an example, as shown in FIG. 4, in an embodiment in which the organic light-emitting element 310 is disposed on the thin-film transistor 210, the planarization layer 140 may cover the thin-film transistor 210 to provide an approximately flat upper surface for the organic light-emitting element 310. The planarization layer 140 may include, for example, an acryl, benzocyclobutene (BCB), or hexamethyldisiloxane (HMDSO). Although it is shown in FIG. 4 that the planarization layer 140 is a single layer, the planarization layer 140 may be a multi-layer. However, various modifications may be made.

In the display area DA of the substrate 100, a display element may be disposed on the planarization layer 140. It is shown in FIG. 4 that the organic light-emitting element 310, as a display element, is disposed on the planarization layer 140. The organic light-emitting element 310 may include a pixel electrode 311, an opposite electrode 315, and an intermediate layer 313. The intermediate layer 313 is disposed between the pixel electrode 311 and the opposite electrode 315 and includes an emission layer. As shown in FIG. 4, the pixel electrode 311 may be electrically connected to the thin-film transistor 210 by contacting one of the source electrode 215*a* and the drain electrode 215*b* through a contact hole (e.g., a contact opening) formed in the planarization layer 140 and the like. The pixel electrode 311 includes a light-transmissive conductive layer and a reflective layer. The light-transmissive conductive layer includes a light-transmissive conductive oxide, such as indium tin oxide (ITO), indium oxide (e.g., $In_2O_3$), or indium zinc oxide (IZO), and the reflective layer includes a metal, such as aluminum (Al) or silver (Ag). As an example, the pixel electrode 311 may have a three-layer structure of ITO/Ag/ITO.

A pixel-defining layer 150 may be disposed on the planarization layer 140. The pixel-defining layer 150 has an opening corresponding to each sub-pixel to define a pixel, that is, an opening exposing at least a central portion of the pixel electrode 311. In addition, as shown in FIG. 4, the pixel-defining layer 150 prevents arcs and the like from occurring at the edges of the pixel electrode 311 by increasing a distance between the edges of the pixel electrode 311 and the opposite electrode 315 over the pixel electrode 311. The pixel-defining layer 150 may include an organic material, such as polyimide or HMDSO.

The intermediate layer 313 of the organic light-emitting element 310 may include a low-molecular weight material or a polymer material. In an embodiment in which the intermediate layer 313 includes a low molecular weight material, the intermediate layer 313 may have a structure in which a hole injection layer (HIL), a hole transport layer (HTL), an emission layer (EML), an electron transport layer (ETL), an electron injection layer (EIL), etc. are stacked in a single or composite configuration. The intermediate layer 312 may be formed by vacuum deposition. In an embodiment in which the intermediate layer 313 includes a polymer material, the intermediate layer 313 may have a structure including an HTL and an EML. The intermediate layer 313 may be formed by screen printing, inkjet printing, laser induced thermal imaging (LITI), or the like. The intermediate layer 313 is not necessarily limited thereto and may have various suitable structures. In addition, the intermediate layer 313 may include a layer continuously formed over the plurality of pixel electrodes 311 and/or may include a layer patterned to correspond to each of the plurality of pixel electrodes 311.

The opposite electrode 315 may be arranged in the upper portion of the display area DA and arranged to cover the display area DA. That is, the opposite electrode 315 may be integrally formed over the plurality of organic light-emitting elements 310 and may correspond to the plurality of pixel electrodes 311. The opposite electrode 315 may include a light-transmissive conductive layer including ITO, $In_2O_3$, or IZO and may include a semi-transmissive layer including a metal, such as aluminum (Al) or silver (Ag). As an example, the opposite electrode 315 may be a semi-transmissive layer including MgAg. The opposite electrode 315 covers the display area DA and extends to the peripheral area PA outside the display area DA. For example, the opposite electrode 315 may be electrically connected to the common voltage supply line 11, described above. Thus, the common voltage ELVSS may be applied to the opposite electrode 315. The opposite electrode 315 may be electrically connected to the second power transfer line PTW2, described below.

The second power input line PIW2 may be arranged in the peripheral area PA to be adjacent to the second edge E2 of the substrate 100 as shown in FIG. 2. The second power input line PIW2 may have a first portion and a second portion. The first portion extends in approximately the second direction (e.g., the x axis direction), and the second portion protrudes from the first portion and extends in the first direction (e.g., the y axis direction). The second portion of the second power input line PIW2 may be electrically connected to the second pad PD2.

One side of the second power transfer line PTW2 extending in the second direction (e.g., the x axis direction) to be approximately parallel to the first portion of the second power input line PIW2 may be connected to the common voltage supply line 11. In some embodiments, the second power transfer line PTW2 may be integrally formed with the common voltage supply line 11.

Each of the second power connection lines PCL2 may be arranged in the peripheral area PA and adjacent to the second edge E2 to correspond to a space between the first edge E1 of the substrate 100 and the first power connection lines PCL1 in the second direction (e.g., the x axis direction). Each of the second power connection lines PCL2 may extend in the first direction (e.g., the y axis direction) to electrically connect the second power input line PIW2 to the second power transfer line PTW2.

That is, as shown in FIGS. 2 and 6, the end portion of each of the second power connection lines PCL2 in a direction (e.g., the −y direction) away from the display area DA (e.g., in a direction opposite to a direction toward the display area DA) may be disposed below the second power input line PIW2 and may be electrically connected to the second power input line PIW2 through a contact hole (e.g., a contact opening) formed in an insulating layer thereon. In addition, the end portion of each of the second power connection lines PCL2 in a direction (e.g., the +y direction) toward the display area DA may be disposed below the second power transfer line PTW2 and may be electrically connected to the second power transfer line PTW2 through a contact hole (e.g., a contact opening) formed in the insulating layer thereon. Accordingly, the common voltage ELVSS input from the printed circuit board through the second pad PD2 may be transferred to the common voltage supply line 11 through the second power input line PIW2, the second power connection lines PCL2, and the second power transfer line PTW2, and as a result, the common voltage ELVSS may be applied to the opposite electrode 315 electrically connected to the common voltage supply line 11.

Each of the second power connection lines PCL2 may have the same structure as the 1-2$^{th}$ power connection line PCL1-2. That is, a cross-sectional view taken along a lengthwise direction of each of the second power connection lines PCL2 may be the same as a cross-sectional view taken along a lengthwise direction of each of the 1-2$^{th}$ power connection lines PCL1-2, as shown in FIG. 5. For example, the second power connection line PCL2 may include a first conducive layer disposed on the first insulating layer and a second conductive layer disposed on the second insulating layer. That is, the second power connection line PCL2 may have a multi-layer structure including conductive layers spaced apart from each other vertically.

The first insulating layer may be, for example, the second gate insulating layer 122, described above, and the second insulating layer may be the first gate insulating layer 121, described above. The first gate insulating layer 121 may be disposed below the second gate insulating layer 122. Accordingly, the second gate insulating layer 122, which is the first insulating layer, may cover the second conductive layer disposed on the first gate insulating layer 121, which is the second insulating layer, from among the first conductive layer and the second conductive layer of the second power connection line PCL2. In addition, the first conductive layer of the second power connection line PCL2 may be disposed on the second conductive layer of the second power connection line PCL2.

As shown in FIG. 6, when viewed in a direction (e.g., the z axis direction) perpendicular to the substrate 100, the first conductive layer and the second conductive layer of the second power connection line PCL2 may overlap each other. When viewed in the direction (e.g., the z axis direction) perpendicular to the substrate 100, the first conductive layer of the second power connection line PCL2 may overlap the second conductive layer of the second power connection line PCL2. This is because the length in the first direction (e.g., the y axis direction) of the second conductive layer included in the second power connection line PCL2 is greater than the length in the first direction (e.g., the y axis direction) of the first conductive layer included in the second power connection line PCL2.

The second power input line PIW2 is electrically connected to each of the first conductive layer and the second conductive layer of the second power connection line PCL2. That is, in the first conductive layer of the second power connection line PCL2, which extends in the first direction (e.g., the y axis direction), the end portion in a direction (e.g., the −y direction) opposite to a direction toward the display area DA is disposed below the second power input line PIW2 and is electrically connected to the second power input line PIW2 through a contact hole (e.g., a contact opening) formed in the insulating layer thereon. In addition, in second conductive layer of the second power connection line PCL2 extending in the first direction (e.g., the y axis direction), the end portion in a direction (e.g., the −y direction) opposite to a direction toward the display area DA is disposed below the second power input line PIW2 and is electrically connected to the second power input line PIW2 through a contact hole (e.g., a contact opening) formed in the insulating layers thereon. Thus, when viewed in a direction (e.g., the z axis direction) perpendicular to the substrate 100, the end portion in the direction (e.g., the −y direction) opposite to the direction toward the display area DA of the second conductive layer of the second power connection line PCL2 may be closer to the second edge E2 than the end portion in the direction (e.g., the −y direction) opposite to the direction toward the display area DA of the first conductive layer of the second power connection line PCL2.

The second power transfer line PTW2 is electrically connected to each of the first conductive layer and the second conductive layer of the second power connection line PCL2. That is, in the first conductive layer of the second power connection line PCL2 extending in the first direction (e.g., the y axis direction), the end portion in a direction (e.g., the +y direction) toward the display area DA is disposed below the second power transfer line PTW2 and is electrically connected to the second power transfer line PTW2 through a contact hole (e.g., a contact opening) formed in the insulating layer thereon. In addition, in the second conductive layer of the second power connection line PCL2 extending in the first direction (e.g., the y axis direction), the end portion in a direction (e.g., the +y direction) toward the display area DA is disposed below the second power transfer line PTW2 and is electrically connected to the second power transfer line PTW2 through a contact hole (e.g., a contact opening) formed in the insulating layers thereon. Thus, when viewed in a direction (e.g., the z axis direction) perpendicular to the substrate 100, the end portion in the direction (e.g., the +y direction) to the display area DA of the second conductive layer of the second power connection line PCL2 may be closer to the display area DA than the end portion in the direction (e.g., the +y direction) to the display area DA of the first conductive layer of the second power connection line PCL2.

As described above, the common voltage ELVSS input from the printed circuit board through the second pad PD2 may be transferred to the common voltage supply line 11 through the second power input line PIW2, the second power connection lines PCL2, and the second power transfer line PTW2, and as a result, the common voltage ELVSS may be applied to the common electrode 315 (see, e.g., FIG. 4), which are electrically connected to the common voltage supply line 11. In such an embodiment, because the second power connection line PCL2 has a multi-layered structure including the first conductive layer and the second conductive layer as described above, voltage drop (e.g., IR drop) due to a resistance may be prevented or reduced in transferring the common voltage ELVSS.

Figure 7:
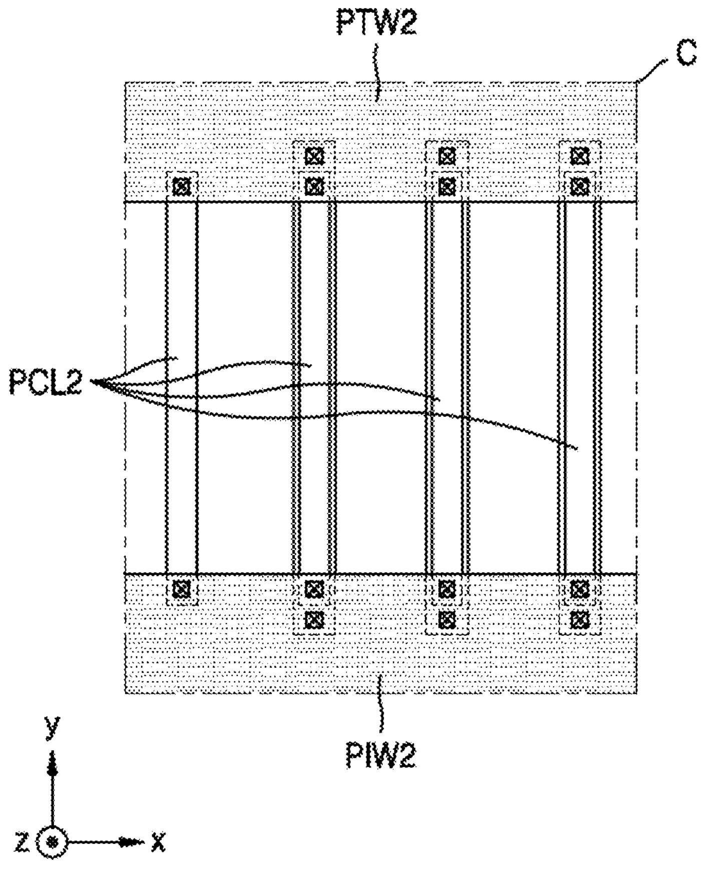
FIG. 7 is an enlarged view of a portion of a display apparatus according to an embodiment.

An interval between wirings may narrow to implement a high-resolution display apparatus. Accordingly, an interval (or spacing) between the scan driving circuit line SDL and the second power connection line PCL2 may narrow and a short-circuit may occur therebetween. Therefore, as shown in FIG. 7, which is an enlarged schematic view of a portion of a display apparatus according to an embodiment, the structure of the second power connection line PCL2 that is most adjacent (e.g., in the −x direction) to (or nearest to) the scan driving circuit line SDL from among the second power connection lines PCL2 may have a different structure from that of the other second power connection lines PCL2.

For example, the second power connection line PCL2 that is most adjacent to the scan driving circuit line SDL from among the second power connection lines PCL2 may include only the first conductive layer, similar to the 1-1$^{th}$ power connection line PCL1-1. Accordingly, even when an interval between the scan driving circuit line SDL, which is arranged on the same layer as the second conductive layer of the 1-2$^{th}$ power connection line PCL1-2, and the second power connection line PCL2 that is most adjacent to the scan driving circuit line SDL from among the second power connection lines PCL2 narrows, a short-circuit may be effectively prevented from occurring between the scan driving circuit line SDL and the second power connection line PCL2 that is most adjacent to the scan driving circuit line SDL from among the second power connection lines PCL2.

As shown in FIG. 4, the display apparatus, according to an embodiment, may include an encapsulation layer 410. The encapsulation layer 410 may cover the display element, such as the organic light-emitting element 310, and may include a first inorganic encapsulation layer 411, an organic encapsulation layer 413 on the first inorganic encapsulation layer 411, and a second inorganic encapsulation layer 415 on the organic encapsulation layer 413. The first inorganic encapsulation layer 411 and the second inorganic encapsulation layer 415 may each include silicon oxide, silicon nitride, or silicon oxynitride.

As shown in FIG. 5, the planarization layer 140 including an organic material has an opening to expose the interlayer insulating layer 131, which is an inorganic material layer thereunder. The opening in the planarization layer 140 may extend in (e.g., may primarily extend in) the second direction (e.g., the x axis direction). Accordingly, the first inorganic encapsulation layer 411 of the encapsulation layer 410 may be in direct contact with the interlayer insulating layer 131, which is an inorganic material layer. Adhesive force between the first inorganic encapsulation layer 411 of the encapsulation layer 410 with a layer including an inorganic material is greater than adhesive force between the first inorganic encapsulation layer 411 of the encapsulation layer 410 with a layer including an organic material. Accordingly, because the planarization layer 140 including an organic material has the opening extending in the second direction (e.g., the x axis direction), the first inorganic encapsulation layer 411 of the encapsulation layer 410 is in direct contact with the interlayer insulating layer 131, which is an inorganic material layer, and thus, the encapsulation layer 410 may be securely bonded to a layer thereunder. In addition, because the first power connection line PCL1, the second power connection line PCL2, and the power connection auxiliary lines PCL1' may be referred to as inorganic material layers including metal, the first inorganic encapsulation layer 411 of the encapsulation layer 410 may be in direct contact with the inorganic material layer including a metal.

In addition, because the first power input line PIW1, the second power input line PIW2, the first power transfer line PTW1, and/or the second power transfer line PTW2 may be referred to as inorganic material layers including a metal, the first power input line PIW1 and the first power transfer line PTW1 may be directly connected to each other without going through the first power connection line PCL1 and the power connection auxiliary lines PCL1', the second power input line PIW2 and the second power transfer line PTW2 may be directly connected to each other without going through the second power connection line PCL2, and the first inorganic encapsulation layer 411 of the encapsulation layer 410 may be in direct contact with these. However, because the first power input line PIW1, the first power transfer line PTW1, the second power input line PIW2, and/or the second power transfer line PTW2 include the same material as the source electrode 215*a* or the drain electrode 215*b* and are formed concurrently (or simultaneously) therewith, and in an embodiment in which the first power input line PIW1, the first power transfer line PTW1, the second power input line PIW2, and/or the second power transfer line PTW2 each have a three-layered structure of Ti/Al/Ti, because etching rate of Al is greater than etching rate of Ti during the manufacturing process, a tip in which the Ti layer, which is an uppermost layer, protrudes to the outside of the Al layer may be formed. In addition, the tip may be detached from the first power input line PIW1, the first power transfer line PTW1, the second power input line PIW2, and/or the second power transfer line PTW2 and may be in contact with another conductive layer, and thus, may cause defects of the display apparatus.

In the display apparatus according to an embodiment, during the manufacturing process, the first power input line PIW1, the first power transfer line PTW1, the second power input line PIW2, and/or the second power transfer line PTW2 are covered by the planarization layer 140 immediately after being formed. In addition, corresponding ones of these are connected to each other by the first power connection line PCL1, power connection auxiliary lines PCL1', and/or the second power connection line PCL2 disposed thereunder. Accordingly, in addition to effectively preventing defects from occurring during the manufacturing process, the first inorganic encapsulation layer 411 may be in direct contact with the first power connection line PCL1 or the second power connection line PCL2, which are inorganic insulating layers, outside the display area DA, or may be in direct contact with the interlayer insulating layer 131, which is an inorganic insulating layer covering these, and thus, an encapsulation effect may be excellent.

Figure 8:
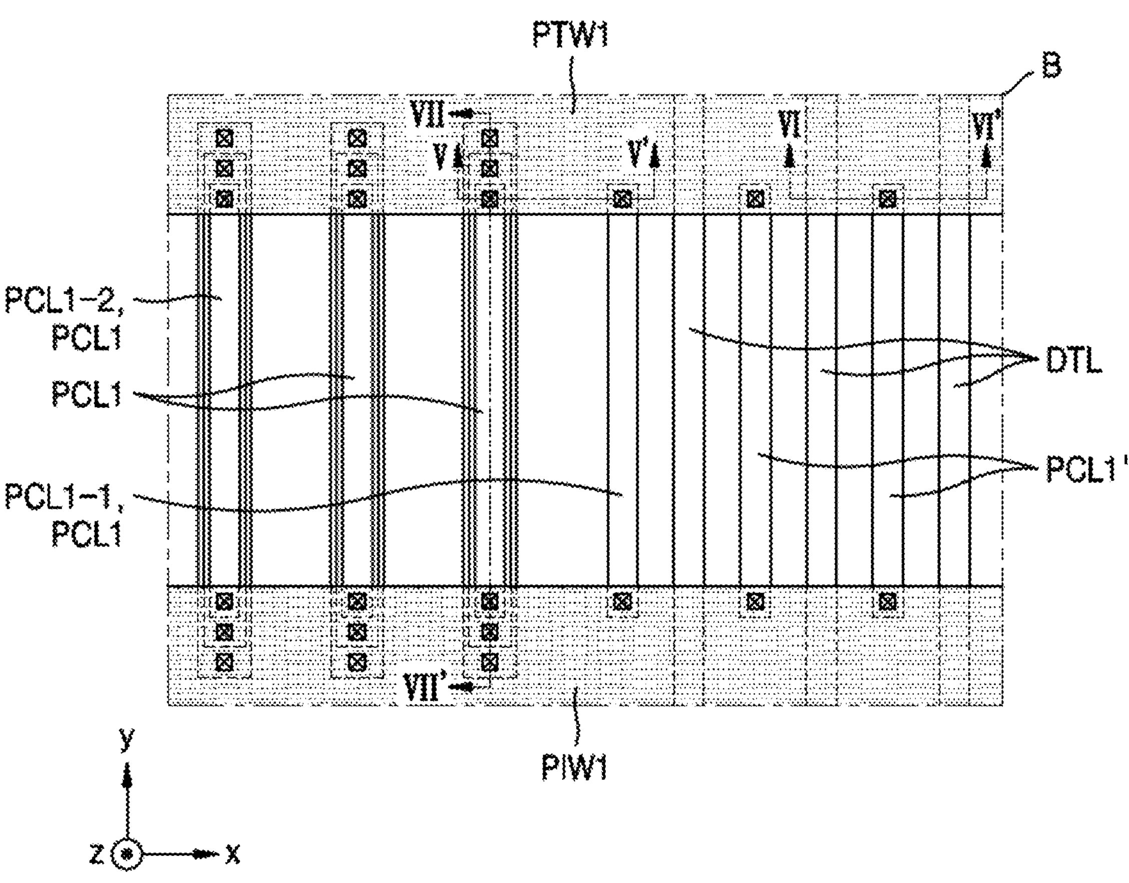
FIG. 8 is an enlarged view of a portion of a display apparatus according to an embodiment.
Figure 9:
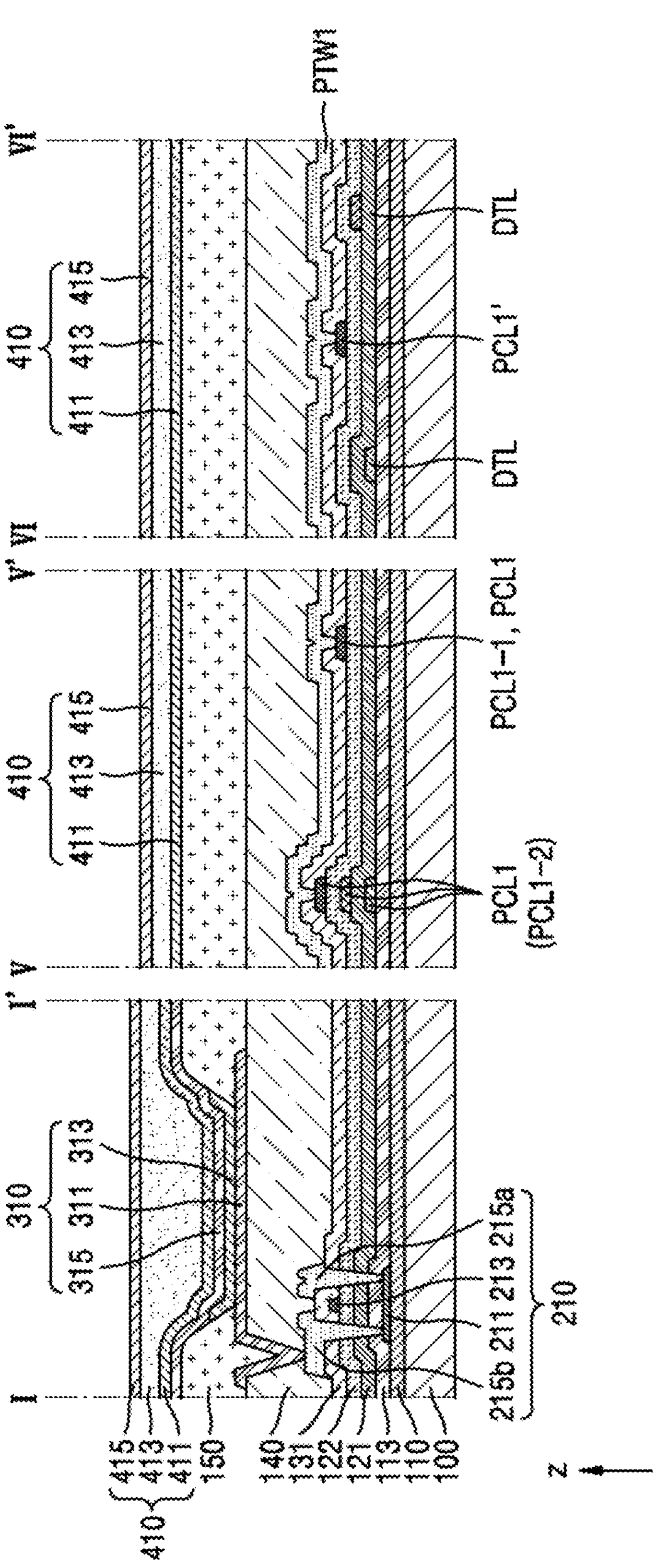
FIG. 9 is a schematic cross-sectional view of the display apparatus shown in FIG. 8 taken along the line I-I' of FIG. 1, the line V-V' of FIG. 8, and the line VI-VI' of FIG. 8.
Figure 10:
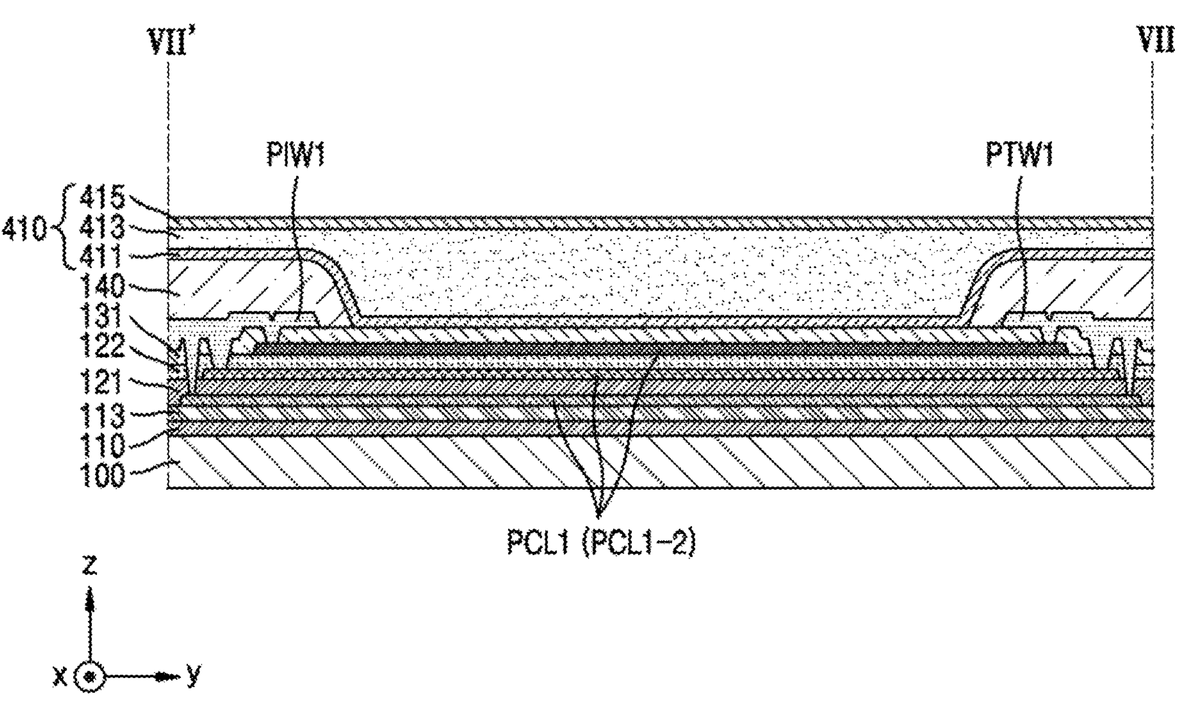
FIG. 10 is a schematic cross-sectional view of the display apparatus shown in FIG. 8 taken along the line VII-VII' of FIG. 8.

FIG. 8 is an enlarged view of a portion of a display apparatus according to an embodiment, FIG. 9 is a schematic cross-sectional view of a display apparatus shown in FIG. 8 taken along the line I-I' of FIG. 1, the line V-V' of FIG. 8, and the line VI-VI' of FIG. 8, and FIG. 10 is a schematic cross-sectional view of the display apparatus shown in FIG. 8 taken along the line VII-VII' of FIG. 8.

As shown in FIGS. 8 to 10, in the display apparatus according to an embodiment, the 1-$2^{th}$ power connection line PCL1-2 that is farthest away from the data transfer line DTL from among the first power connection lines PCL1 may include the first conductive layer on the first insulating layer, the second conductive layer on the second insulating layer, and a third conductive layer on a third insulating layer.

At least some of the first power connection lines PCL1 other than the 1-$1^{th}$ power connection line PCL1-1 and the 1-$2^{th}$ power connection line PCL1-2 may have the same multi-layered structure as the 1-$2^{th}$ power connection line PCL1-2. It is shown as an example in FIGS. 8, 9, and 10 that each of the first power connection lines PCL1 other than the 1-$1^{th}$ power connection line PCL1-1 and the 1-$2^{th}$ power connection line PCL1-2 may have the same structure as the 1-$2^{th}$ power connection line PCL1-2. Hereinafter, description is made with respect to an embodiment in which each of the first power connection lines PCL1 other than the 1-$1^{th}$ power connection line PCL1-1 and the 1-$2^{th}$ power connection line PCL1-2 have the same configuration as the 1-$2^{th}$ power connection line PCL1-2.

The first insulating layer may be, for example, the second gate insulating layer 122, as described above, the second insulating layer may be the first gate insulating layer 121, as described above, and the third insulating layer disposed under the second insulating layer may be a third gate insulating layer 113 disposed between the first gate insulating layer 121 and the semiconductor layer 211, as shown in FIG. 9. The third gate insulating layer 113 may include an inorganic material, such as silicon oxide, silicon nitride, and/or silicon oxynitride. Accordingly, the second gate insulating layer 122, which is the first insulating layer, may cover the second conductive layer of the 1-$2^{th}$ power connection line PCL1-2, and the first gate insulating layer 121, which is the second insulating layer, may cover the third conductive layer of the 1-$2^{th}$ power connection line PCL1-2.

In addition, the second conductive layer of the 1-2$^{th}$ power connection line PCL1-2 may be disposed on the third conductive layer of the 1-2$^{th}$ power connection line PCL1-2, and the first conductive layer of the 1-2$^{th}$ power connection line PCL1-2 may be disposed on the second conductive layer of the 1-2$^{th}$ power connection line PCL1-2.

For reference, the semiconductor layer 211, such as polycrystalline silicon, may be disposed on the buffer layer 110 in the display area DA, and an oxide semiconductor layer may be disposed between the first gate insulating layer 121 and the second gate insulating layer 122. An additional insulating layer may be disposed between the first gate insulating layer 121 and the second gate insulating layer 122, and an oxide semiconductor layer may be disposed between the additional insulating layer and the second gate insulating layer 122.

As shown in FIG. 8, when viewed in a direction (e.g., the z axis direction) perpendicular to the substrate 100 (when viewed in a plan view), the first conductive layer, the second conductive layer, and the third conductive layer of the 1-2$^{th}$ power connection line PCL1-2 may overlap each other. Specifically, when viewed in the direction (e.g., the z axis direction) perpendicular to the substrate 100, the first conductive layer of the 1-2$^{th}$ power connection line PCL1-2 may overlap the second conductive layer of the 1-2$^{th}$ power connection line PCL1-2. This is because the length in the first direction (e.g., the y axis direction) of the second conductive layer included in the 1-2$^{th}$ power connection line PCL1-2 is greater than the length in the first direction (e.g., the y axis direction) of the first conductive layer included in the 1-2$^{th}$ power connection line PCL1-2. Similarly, when viewed in the direction (e.g., the z axis direction) perpendicular to the substrate 100, the second conductive layer of the 1-2$^{th}$ power connection line PCL1-2 may overlap the third conductive layer of the 1-2$^{th}$ power connection line PCL1-2. This is because the length in the first direction (e.g., the y axis direction) of the third conductive layer included in the 1-2$^{th}$ power connection line PCL1-2 is greater than the length in the first direction (e.g., the y axis direction) of the second conductive layer included in the 1-2$^{th}$ power connection line PCL1-2.

The first power input line PIW1 is electrically connected to the first conductive layer of the 1-1$^{th}$ power connection line PCL1-1. In addition, the first power input line PIW1 is electrically connected to each of the first conductive layer, the second conductive layer, and the third conductive layer of the 1-2$^{th}$ power connection line PCL1-2. That is, in each of the first conductive layer of the 1-1$^{th}$ power connection line PCL1-1 and the first conductive layer of the 1-2$^{th}$ power connection line PCL1-2, each of which extend in the first direction (e.g., the y axis direction), the end portion in a direction (e.g., the −y direction) opposite to a direction toward the display area DA is disposed below the first power input line PIW1 and is electrically connected to the first power input line PIW1 through a contact hole (e.g., a contact opening) formed in the insulating layer thereon. In addition, even in the second conductive layer of the 1-2$^{th}$ power connection line PCL1-2, which extends in the first direction (e.g., the y axis direction), the end portion in a direction (e.g., the −y direction) opposite to a direction toward the display area DA is disposed below the first power input line PIW1 and is electrically connected to the first power input line PIW1 through a contact hole (e.g., a contact opening) formed in the insulating layers thereon. In addition, even in an embodiment in which the third conductive layer of the 1-2$^{th}$ power connection line PCL1-2, which extends in the first direction (e.g., the y axis direction), the end portion in a direction (e.g., the −y direction) opposite to a direction toward the display area DA is disposed below the first power input line PIW1 and is electrically connected to the first power input line PIW1 through a contact hole (e.g., a contact opening) formed in the insulating layers thereon.

For this purpose, when viewed in a direction (e.g., the z axis direction) perpendicular to the substrate 100, the end portion in the direction (e.g., the −y direction) opposite to the direction toward the display area DA of the second conductive layer of the 1-2$^{th}$ power connection line PCL1-2 may be closer to the second edge E2 than the end portion in the direction (e.g., the −y direction) opposite to the direction toward the display area DA of the first conductive layer of the 1-2$^{th}$ power connection line PCL1-2 is. Similarly, the end portion in a direction (e.g., the −y direction) opposite to a direction toward the display area DA of the third conductive layer of the 1-2$^{th}$ power connection line PCL1-2 may be closer to the second edge E2 than the end portion in a direction (e.g., the −y direction) opposite to a direction toward the display area DA of the second conductive layer of the 1-2$^{th}$ power connection line PCL1-2 is.

The first power transfer line PTW1 is electrically connected to the first conductive layer of the 1-1$^{th}$ power connection line PCL1-1. In addition, the first power transfer line PTW1 is electrically connected to each of the first conductive layer, the second conductive layer, and the third conductive layer of the 1-2$^{th}$ power connection line PCL1-2. That is, in each of the first conductive layer of the 1-1$^{th}$ power connection line PCL1-1 and the first conductive layer of the 1-2$^{th}$ power connection line PCL1-2, each of which extends in the first direction (e.g., the y axis direction), the end portion in a direction (e.g., the +y direction) toward the display area DA is disposed below the first power transfer line PTW1 and is electrically connected to the first power transfer line PTW1 through a contact hole (e.g., a contact opening) formed in the insulating layer thereon. In addition, even in the second conductive layer of the 1-2$^{th}$ power connection line PCL1-2 extending in the first direction (e.g., the y axis direction), the end portion in a direction (e.g., the +y direction) to the display area DA is disposed below the first power transfer line PTW1 and is electrically connected to the first power transfer line PTW1 through a contact hole (e.g., a contact opening) formed in the insulating layers thereon. In addition, even in the third conductive layer of the 1-2$^{th}$ power connection line PCL1-2 extending in the first direction (e.g., the y axis direction), the end portion in a direction (e.g., the +y direction) toward the display area DA is disposed below the first power transfer line PTW1 and is electrically connected to the first power transfer line PTW1 through a contact hole (e.g., a contact opening) formed in the insulating layers thereon.

For this purpose, when viewed in a direction (e.g., the z axis direction) perpendicular to the substrate 100, the end portion in the direction (e.g., the +y direction) toward the display area DA of the second conductive layer of the 1-2$^{th}$ power connection line PCL1-2 may be closer to the display area DA than the end portion in the direction (e.g., the +y direction) toward the display area DA of the first conductive layer of the 1-2$^{th}$ power connection line PCL1-2 is. In addition, the end portion in a direction (e.g., the +y direction) toward the display area DA of the third conductive layer of the 1-2$^{th}$ power connection line PCL1-2 may be closer to the display area DA than the end portion in a direction (e.g., the +y direction) toward the display area DA of the second conductive layer of the 1-2$^{th}$ power connection line PCL1-2 is.

As described above, the driving voltage ELVDD input from the printed circuit board through the fourth pad PD4 may be transferred to the driving power lines through the first power input line PIW1, the first power connection line PCL1, and the first power transfer line PTW1, and as a result, the driving voltage ELVDD may be applied to each pixel electrically connected to the driving power lines. In such an embodiment, because the 1-$2^{th}$ power connection line PCL1-2 and the like included in the first power connection line PCL1 include the multi-layered structure including the first conductive layer, the second conductive layer, and the third conductive layer as described above, voltage drop (e.g., IR drop) due to a resistance may be prevented or reduced in transferring the driving voltage ELVDD.

In an embodiment in which the number of data transfer lines DTL increases to implement a high-resolution display apparatus, an interval between the data transfer lines DTL narrows in a plan view, and a probability that a short-circuit occurs between the data transfer lines DTL increases. To prevent this, as shown in FIG. 9, adjacent data transfer lines DTL may be disposed on different insulating layers. As an example, in an embodiment in which one data transfer line DTL is disposed on the first gate insulating layer 121, which is the second insulating layer, the data transfer line DTL adjacent thereto may be disposed on the third gate insulating layer 113, which is the third insulating layer. As described above, the data transfer lines DTL may be disposed on the second insulating layer or the third insulating layer.

For example, the 1-$1^{th}$ power connection line PCL1-1 that is most adjacent to the data transfer lines DTL from among the first power connection lines PCL1 may include only the first conductive layer as described above. Because the first conductive layer disposed on the second gate insulating layer 122, which is the first insulating layer, is disposed on a layer different from the second conductive layer or the third conductive layer, a short-circuit may be prevented from occurring between the 1-$1^{th}$ power connection line PCL1-1 and the data transfer line DTL adjacent thereto through this configuration.

For reference, similar to the description above with reference to FIGS. 2 and 3, as shown in FIGS. 8 and 9, the power connection auxiliary line PCL1' may be disposed between the data transfer lines DTL. This is as described above.

Figure 11:
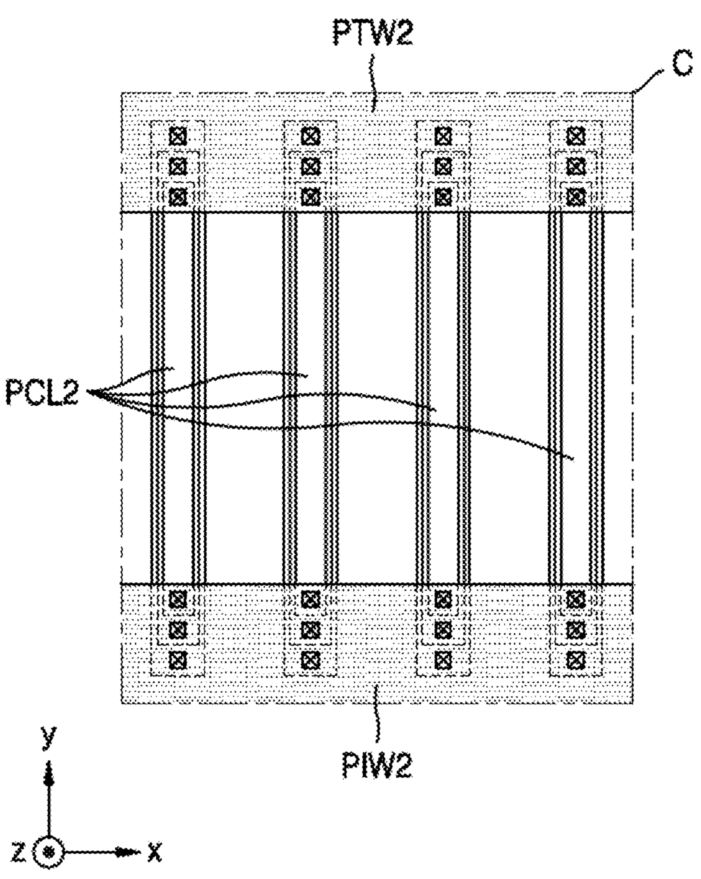
FIG. 11 is an enlarged view of a portion of a display apparatus according to an embodiment.

Even in the second power connection lines PCL2, as shown in FIG. 11, which is an enlarged schematic view of a portion of a display apparatus according to an embodiment, the display apparatus may have a three-layer structure. As described above, the end portion of each of the second power connection lines PCL2 in a direction (e.g., the −y direction) away from the display area DA may be disposed below the second power input line PIW2 and electrically connected to the second power input line PIW2 through a contact hole (e.g., a contact opening) formed in an insulating layer thereon. In addition, the end portion of each of the second power connection lines PCL2 in a direction (e.g., the +y direction) to the display area DA may be disposed below the second power transfer line PTW2 and electrically connected to the second power transfer line PTW2 through a contact hole (e.g., a contact opening) formed in the insulating layer thereon. Accordingly, the common voltage ELVSS input from the printed circuit board through the second pad PD2 may be transferred to the common voltage supply line 11 through the second power input lines PIW2, the second power connection lines PCL2, and the second power transfer line PTW2, and as a result, the common voltage ELVSS may be applied to the common electrode 315 (see, e.g., FIG. 9) electrically connected to the common voltage supply line 11.

Each of the second power connection lines PCL2 may have the same structure as the 1-$2^{th}$ power connection line PCL1-2 described above with reference to FIGS. 8 to 10. For example, a cross-sectional view taken along a lengthwise direction of each of the second power connection lines PCL2 may be the same as a cross-sectional view taken along a lengthwise direction of the 1-$2^{th}$ power connection lines PCL1-2 as shown in FIG. 10. Specifically, the second power connection line PCL2 may include the first conducive layer, the second conductive layer, and the third conductive layer, in which the first conductive layer is disposed on the first insulating layer, the second conductive layer is disposed on the second insulating layer, and the third conductive layer is disposed on the third insulating layer. That is, the second power connection line PCL2 may have a multi-layer structure including conductive layers spaced apart from each other approximately vertically.

As an example, the first insulating layer may be the second gate insulating layer 122, as described above, the second insulating layer may be the first gate insulating layer 121, as described above, and the third insulating layer may be the third gate insulating layer 113, as described above. The first gate insulating layer 121 may be disposed under the second gate insulating layer 122, and the third gate insulating layer 113 may be disposed under the first gate insulating layer 121. Accordingly, the second gate insulating layer 122, which is the first insulating layer, may cover the second conductive layer of the second power connection line PCL2, and the first gate insulating layer 121, which is the second insulating layer, may cover the third conductive layer of the second power connection line PCL2. In addition, the first conductive layer of the second power connection line PCL2 may be disposed on the second conductive layer of the second power connection line PCL2, and the second conductive layer of the second power connection line PCL2 may be disposed on the third conductive layer of the second power connection line PCL2.

As shown in FIG. 11, when viewed in a direction (e.g., the z axis direction) perpendicular to the substrate 100, the first conductive layer, the second conductive layer, and the third conductive layer of the second power connection line PCL2 may overlap each other. For example, when viewed in the direction (e.g., the z axis direction) perpendicular to the substrate 100, the first conductive layer of the second power connection line PCL2 may overlap the second conductive layer of the second power connection line PCL2. This is because the length in the first direction (e.g., the y axis direction) of the second conductive layer included in the second power connection line PCL2 is greater than the length in the first direction (e.g., the y axis direction) of the first conductive layer included in the second power connection line PCL2. In addition, when viewed in the direction (e.g., the z axis direction) perpendicular to the substrate 100, the second conductive layer of the second power connection line PCL2 may overlap the third conductive layer of the second power connection line PCL2. This is because the length in the first direction (e.g., the y axis direction) of the third conductive layer included in the second power connection line PCL2 is greater than the length in the first direction (e.g., the y axis direction) of the second conductive layer included in the second power connection line PCL2.

The second power input line PIW2 is electrically connected to each of the first conductive layer, the second conductive layer, and the third conductive layer of the second power connection line PCL2. That is, in an embodiment in which the first conductive layer of the second power connection line PCL2, which extends in the first direction (e.g., the y axis direction), the end portion in a direction (e.g., the −y direction) opposite to a direction toward the display area DA is disposed below the second power input line PIW2 and is electrically connected to the second power input line PIW2 through a contact hole (e.g., a contact opening) formed in the insulating layer thereon. In addition, even in the second conductive layer of the second power connection line PCL2 extending in the first direction (e.g., the y axis direction), the end portion in a direction (e.g., the −y direction) opposite to a direction toward the display area DA is disposed below the second power input line PIW2 and is electrically connected to the second power input line PIW2 through a contact hole (e.g., a contact opening) formed in the insulating layers thereon. In addition, even in the third conductive layer of the second power connection line PCL2 extending in the first direction (e.g., the y axis direction), the end portion in a direction (e.g., the −y direction) opposite to a direction to the display area DA is disposed below the second power input line PIW2 and is electrically connected to the second power input line PIW2 through a contact hole (e.g., a contact opening) formed in the insulating layers thereon.

For this purpose, when viewed in a direction (e.g., the z axis direction) perpendicular to the substrate 100, the end portion in the direction (e.g., the −y direction) opposite to the direction toward the display area DA of the second conductive layer of the second power connection line PCL2 may be closer to the second edge E2 than the end portion in the direction (e.g., the −y direction) opposite to the direction toward the display area DA of the first conductive layer of the second power connection line PCL2 is. In addition, the end portion in a direction (e.g., the −y direction) opposite to a direction toward the display area DA of the third conductive layer of the second power connection line PCL2 may be closer to the second edge E2 than the end portion in a direction (e.g., the −y direction) opposite to a direction toward the display area DA of the second conductive layer of the second power connection line PCL2 is.

The second power transfer line PTW2 is electrically connected to each of the first conductive layer, the second conductive layer, and the third conductive layer of the second power connection line PCL2. That is, in the first conductive layer of the second power connection line PCL2 extending in the first direction (e.g., the y axis direction), the end portion in a direction (e.g., the +y direction) toward the display area DA is disposed below the second power transfer line PTW2 and is electrically connected to the second power transfer line PTW2 through a contact hole (e.g., a contact opening) formed in the insulating layer thereon. In addition, even in the second conductive layer of the second power connection line PCL2 extending in the first direction (e.g., the y axis direction), the end portion in a direction (e.g., the +y direction) toward the display area DA is disposed below the second power transfer line PTW2 and is electrically connected to the second power transfer line PTW2 through a contact hole (e.g., a contact opening) formed in the insulating layers thereon. In addition, even in the third conductive layer of the second power connection line PCL2 extending in the first direction (e.g., the y axis direction), the end portion in a direction (e.g., the +y direction) toward the display area DA is disposed below the second power transfer line PTW2 and is electrically connected to the second power transfer line PTW2 through a contact hole (e.g., a contact opening) formed in the insulating layers thereon.

For this purpose, when viewed in a direction (e.g., the z axis direction) perpendicular to the substrate 100, the end portion in the direction (e.g., the +y direction) to the display area DA of the second conductive layer of the second power connection line PCL2 may be closer to the display area DA than the end portion in the direction (e.g., the +y direction) to the display area DA of the first conductive layer of the second power connection line PCL2 is. Similarly, when viewed in a direction (e.g., the z axis direction) perpendicular to the substrate 100, the end portion in the direction (e.g., the +y direction) to the display area DA of the third conductive layer of the second power connection line PCL2 may be closer to the display area DA than the end portion in the direction (e.g., the +y direction) to the display area DA of the second conductive layer of the second power connection line PCL2 is.

As described above, the common voltage ELVSS input from the printed circuit board through the second pad PD2 may be transferred to the common voltage supply line 11 through the second power input line PIW2, the second power connection lines PCL2, and the second power transfer line PTW2, and as a result, the common voltage ELVSS may be applied to the opposite electrode 315 electrically connected to the common voltage supply line 11. In this embodiment, because the second power connection line PCL2 has a multi-layer structure including the first conductive layer, the second conductive layer, and the third conductive layer, as described above, voltage drop (e.g., IR drop) due to a resistance may be prevented or reduced in transferring the common voltage ELVSS.

Figure 12:
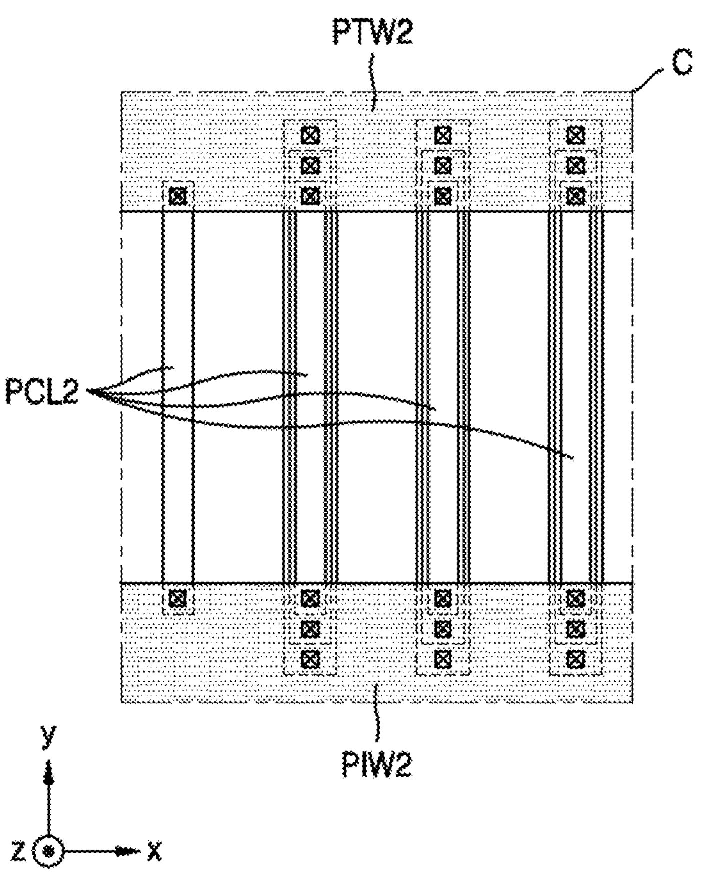
FIG. 12 is an enlarged view of a portion of a display apparatus according to an embodiment.

An interval between wirings may narrow to implement a high-resolution display apparatus. Accordingly, an interval between the scan driving circuit line SDL and the second power connection line PCL2 may narrow and a short-circuit may occur therebetween. With consideration of this, as shown in FIG. 12, which is an enlarged schematic view of a portion of a display apparatus according to an embodiment, the structure of the second power connection line PCL2 that is most adjacent (e.g., in the −x direction) to the scan driving circuit line SDL from among the second power connection lines PCL2 may have a different structure from that of the other second power connection lines PCL2.

For example, the second power connection line PCL2 that is most adjacent to the scan driving circuit line SDL from among the second power connection lines PCL2 may include only the first conductive layer, similar to the 1-1$^{th}$ power connection line PCL1-1. Accordingly, even when an interval between the scan driving circuit line SDL arranged on the same layer as the second conductive layer and/or the third conductive layer of the 1-2$^{th}$ power connection line PCL1-2, and the second power connection line PCL2 that is most adjacent to the scan driving circuit line SDL from among the second power connection lines PCL2 narrows, a short-circuit may be effectively prevented from occurring between the scan driving circuit line SDL and the second power connection line PCL2 that is most adjacent to the scan driving circuit line SDL from among the second power connection lines PCL2. For reference, similar to the data transfer lines DTL described above with reference to FIG. 9, one scan driving circuit line SDL may be disposed on the second insulating layer, and the scan driving circuit line SDL adjacent thereto may be disposed on the third insulating layer.

As described above, the first conductive layer of the 1-1$^{th}$ power connection line PCL1-1 and/or the first conductive layer of the 1-2$^{th}$ power connection line PCL1-2 may be arranged on the same layer as the gate electrode 213. That is, the first conductive layer of the 1-1$^{th}$ power connection line PCL1-1 and/or the first conductive layer of the 1-2$^{th}$ power connection line PCL1-2 may be disposed on the second gate insulating layer 122. The first conductive layer of the 1-1$^{th}$ power connection line PCL1-1 and/or the first conductive layer of the 1-2$^{th}$ power connection line PCL1-2 may include the same material as the gate electrode 213 and be formed concurrently (or simultaneously) therewith and may have the same layered structure as the gate electrode 213. This is also applicable to the first conductive layer of the second power connection line PCL2.

The second conductive layer of the 1-2$^{th}$ power connection line PCL1-2 may include the same material as the gate electrode 213 and may have the same layered structure as the gate electrode 213. This is also applicable to the third conductive layer of the 1-2$^{th}$ power connection line PCL1-2, the second conductive layer of the second power connection line PCL2, and the third conductive layer of the second power connection line PCL2.

According to embodiments of the present disclosure, the display apparatus may display high-quality images. However, the scope of the present disclosure is not limited thereto.

It should be understood that the embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:

a substrate having a display area, a peripheral area outside the display area, a first edge extending in a first direction, and a second edge extending in a second direction crossing the first direction;

a plurality of data transfer lines in the peripheral area, adjacent to the second edge, extending in the first direction, and on a second insulating layer; and first power connection lines in the peripheral area, adjacent to the second edge in a space between the first edge and the plurality of data transfer lines, and extending in the first direction, wherein a 1-1$^{th}$ power connection line that is nearest to the plurality of data transfer lines from among the first power connection lines comprises a conductive layer on a first insulating layer, the first insulating layer being on the second insulating layer, and wherein a 1-2$^{th}$ power connection line that is farthest away from the plurality of data transfer lines from among the first power connection lines comprises:

a first conductive layer on the first insulating layer; and a second conductive layer on the second insulating layer as the plurality of data transfer lines.

2. The display apparatus of claim 1, wherein the first insulating layer covers the second conductive layer in the 1-2$^{th}$ power connection line.

3. The display apparatus of claim 1, wherein the first conductive layer and the second conductive layer in the 1-2$^{th}$ power connection line overlap each other when viewed in a direction perpendicular to the substrate.

4. The display apparatus of claim 1, wherein a length of the second conductive layer in the 1-2$^{th}$ power connection line in the first direction is greater than a length of the first conductive layer in the 1-2$^{th}$ power connection line in the first direction.

5. The display apparatus of claim 1, further comprising a first power input line on end portions of the first power connection lines in a direction away from the display area, electrically connected to the conductive layer in the 1-1$^{th}$ power connection line, and electrically connected to each of the first conductive layer and the second conductive layer in the 1-2$^{th}$ power connection line.

6. The display apparatus of claim 5, further comprising a first power transfer line on end portions of the first power connection lines in a direction toward the display area, electrically connected to the conductive layer in the 1-1$^{th}$ power connection line, and electrically connected to each of the first conductive layer and the second conductive layer in the 1-2$^{th}$ power connection line.

7. The display apparatus of claim 6, further comprising a plurality of driving power lines extending in the first direction and extending into the display area, wherein the first power transfer line extends along the second edge and is electrically connected to the plurality of driving power lines.

8. The display apparatus of claim 1, wherein the 1-2$^{th}$ power connection line further comprises a third conductive layer on a third insulating layer.

9. The display apparatus of claim 8, wherein the third insulating layer is under the second insulating layer.

10. The display apparatus of claim 9, wherein the second insulating layer covers the third conductive layer in the 1-2$^{th}$ power connection line, and the first insulating layer covers the second conductive layer in the 1-2$^{th}$ power connection line.

11. The display apparatus of claim 8, wherein the first conductive layer, the second conductive layer, and the third conductive layer in the 1-2$^{th}$ power connection line overlap one another when viewed in a direction perpendicular to the substrate.

12. The display apparatus of claim 8, wherein a length of the second conductive layer in the 1-2$^{th}$ power connection line in the first direction is greater than a length of the first conductive layer in the 1-2$^{th}$ power connection line in the first direction, and wherein a length of the third conductive layer in the 1-2$^{th}$ power connection line in the first direction is greater than the length of the second conductive layer in the 1-2$^{th}$ power connection line in the first direction.

13. The display apparatus of claim 8, further comprising a first power input line on end portions of the first power connection lines in a direction away from the display area, electrically connected to the first conductive layer in the 1-1$^{th}$ power connection line, and electrically connected to each of the first conductive layer, the second conductive layer, and the third conductive layer in the 1-2$^{th}$ power connection line.

14. The display apparatus of claim 13, further comprising a first power transfer line on end portions of the first power connection lines in a direction toward the display area, electrically connected to the conductive layer in the 1-1$^{th}$ power connection line, and electrically connected to each of the first conductive layer, the second conductive layer, and the third conductive layer in the 1-2$^{th}$ power connection line.

15. The display apparatus of claim 14, further comprising a plurality of driving power lines extending in the first direction and extending into the display area, wherein the first power transfer line extends along the second edge and is electrically connected to the plurality of driving power lines.

16. The display apparatus of claim 1, further comprising second power connection lines in the peripheral area, adjacent to the second edge in a space between the first edge and the first power connection lines, and extending in the first direction, wherein each of the second power connection lines comprises a first conductive layer on the first insulating layer and a second conductive layer on the second insulating layer.

17. The display apparatus of claim 16, wherein the first insulating layer covers the second conductive layer in the $1\text{-}2^{th}$ power connection line and the second conductive layer in each of the second power connection lines.

18. The display apparatus of claim 16, wherein the first conductive layer and the second conductive layer in the $1\text{-}2^{th}$ power connection line overlap each other when viewed in a direction perpendicular to the substrate, and wherein the first conductive layer and the second conductive layer in each of the second power connection lines overlap each other when viewed in the direction perpendicular to the substrate.

19. The display apparatus of claim 18, further comprising a second power input line on end portions of the second power connection lines in a direction away from the display area, and electrically connected to each of the first conductive layer and the second conductive layer in each of the second power connection lines.

20. The display apparatus of claim 19, further comprising a second power transfer line on end portions of the second power connection lines in a direction toward the display area, and electrically connected to each of the first conductive layer and the second conductive layer in each of the second power connection lines.

21. The display apparatus of claim 20, wherein the second power transfer line extends along the second edge and is electrically connected to a common electrode of pixels arranged in the display area.

22. The display apparatus of claim 16, wherein a length of the second conductive layer included in the $1\text{-}2^{th}$ power connection line in the first direction is greater than a length of the first conductive layer included in the $1\text{-}2^{th}$ power connection line in the first direction, and wherein a length of the second conductive layer included in each of the second power connection lines in the first direction is greater than a length of the first conductive layer included in each of the second power connection lines in the first direction.

23. The display apparatus of claim 16, wherein each of the second power connection lines further comprises a third conductive layer on a third insulating layer.

24. The display apparatus of claim 23, wherein the third insulating layer is under the second insulating layer.

25. The display apparatus of claim 24, wherein the second insulating layer covers the third conductive layer in each of the second power connection lines, and wherein the first insulating layer covers the second conductive layer in the $1\text{-}2^{th}$ power connection line and the second conductive layer in each of the second power connection lines.

26. The display apparatus of claim 23, wherein the first conductive layer, the second conductive layer, and the third conductive layer in each of the second power connection lines overlap one another when viewed in a direction perpendicular to the substrate.

27. The display apparatus of claim 23, wherein a length of the second conductive layer included in each of the second power connection lines in the first direction is greater than a length of the first conductive layer included in each of the second power connection lines in the first direction, and wherein a length of the third conductive layer in each of the second power connection lines in the first direction is greater than the length of the second conductive layer included in each of the second power connection lines in the first direction.

28. The display apparatus of claim 23, further comprising a second power input line on end portions of the second power connection lines in a direction away from the display area, and electrically connected to each of the first conductive layer, the second conductive layer, and the third conducive layer in each of the second power connection lines.

29. The display apparatus of claim 28, further comprising a second power transfer line on end portions of the second power connection lines in a direction toward the display area, and electrically connected to each of the first conductive layer, the second conductive layer, and the third conductive layer in each of the second power connection lines.

30. The display apparatus of claim 29, wherein the second power transfer line extends along the second edge and is electrically connected to a common electrode of pixels arranged in the display area.

31. The display apparatus of claim 1, further comprising:

a display element in the display area; and an encapsulation layer covering the display element and comprising an inorganic encapsulation layer and an organic encapsulation layer on the inorganic encapsulation layer, wherein the inorganic encapsulation layer is in direct contact with the first power connection line or is in direct contact with an inorganic insulating layer covering the first power connection line.

32. The display apparatus of claim 1, wherein the conductive layer of the $1\text{-}1^{th}$ power connection line is a bottommost conductive layer of the $1\text{-}1^{th}$ power connection line.

33. The display apparatus of claim 1, wherein the display apparatus is one of a smartphone, a tablet computer, a laptop computer, a television, and an advertisement board.

* * * * *